United States Patent
Shimizu et al.

(10) Patent No.: US 8,558,321 B2
(45) Date of Patent: Oct. 15, 2013

(54) SEMICONDUCTOR DEVICE HAVING GATE INSULATING FILM INCLUDING HIGH DIELECTRIC MATERIAL

(75) Inventors: Hiroji Shimizu, Toyama (JP); Yoshihiro Sato, Toyama (JP); Hideyuki Arai, Toyama (JP); Takayuki Yamada, Toyama (JP); Tsutomu Oosuka, Toyama (JP)

(73) Assignee: Panasonic Corporation, Osaka (JP)

( * ) Notice: Subject to any disclaimer, the term of this patent is extended or adjusted under 35 U.S.C. 154(b) by 109 days.

(21) Appl. No.: 13/005,085

(22) Filed: Jan. 12, 2011

(65) Prior Publication Data

US 2011/0169100 A1    Jul. 14, 2011

(30) Foreign Application Priority Data

Jan. 13, 2010   (JP) ................................. 2010-005129
Nov. 1, 2010   (JP) ................................. 2010-245591

(51) Int. Cl.
    *H01L 21/40*         (2006.01)
(52) U.S. Cl.
    USPC .................... 257/380; 257/411; 257/E29.255
(58) Field of Classification Search
    USPC ............................ 257/369, 380, 411, E29.255
    See application file for complete search history.

(56) References Cited

U.S. PATENT DOCUMENTS

| | | | |
|---|---|---|---|
| 2006/0220157 A1* | 10/2006 | Kalpat et al. ................... | 257/411 |
| 2009/0090977 A1 | 4/2009 | Freeman et al. | |
| 2009/0114995 A1 | 5/2009 | Suzuki et al. | |
| 2010/0052072 A1 | 3/2010 | Li et al. | |
| 2010/0176458 A1* | 7/2010 | Nakajima ..................... | 257/379 |

FOREIGN PATENT DOCUMENTS

JP     2009-117557     5/2009

* cited by examiner

*Primary Examiner* — Tucker Wright
(74) *Attorney, Agent, or Firm* — McDermott Will & Emery LLP

(57) ABSTRACT

A semiconductor device includes: a first MIS transistor of a first conductivity type having a first active region as a region of a semiconductor substrate surrounded by an element isolation region formed in an upper portion of the semiconductor substrate, a first gate insulating film having a first high dielectric film formed on the first active region, and a first gate electrode formed on the first gate insulating film; and a resistance element having a second high dielectric film formed on the element isolation region and a resistance layer made of silicon formed on the second high dielectric film. The first high dielectric film and the second high dielectric film include the same high dielectric material, and the first high dielectric film includes a first adjustment metal, but the second high dielectric film does not include the first adjustment metal.

14 Claims, 15 Drawing Sheets

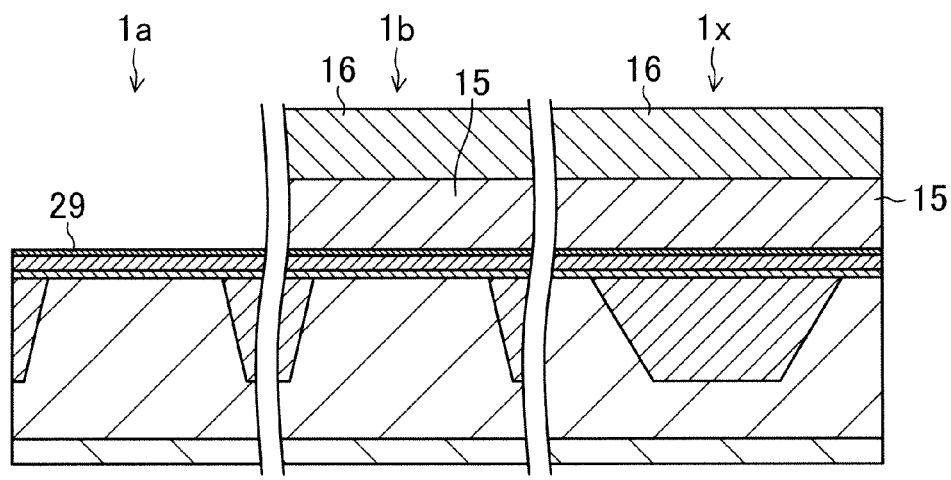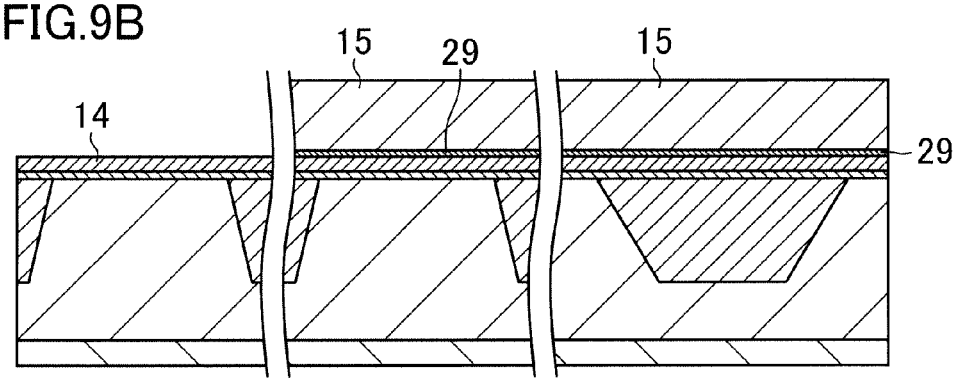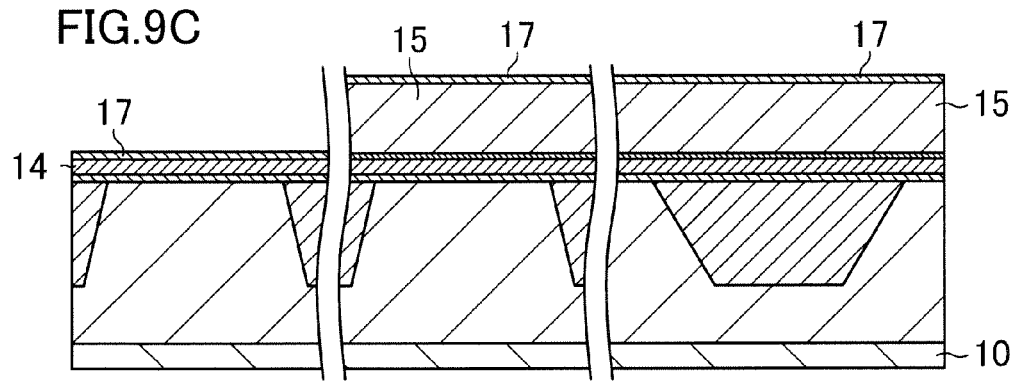

SEMICONDUCTOR DEVICE HAVING GATE INSULATING FILM INCLUDING HIGH DIELECTRIC MATERIAL

CROSS-REFERENCE TO RELATED APPLICATION

This application claims priority to Japanese Patent Application No. 2010-005129 filed on Jan. 13, 2010 and Japanese Patent Application No. 2010-245591 filed on Nov. 1, 2010, the disclosure of which including the specifications, the drawings, and the claims is hereby incorporated by reference in its entirety.

BACKGROUND

The present disclosure relates to a semiconductor device and a method for fabricating the same, and more particularly to a semiconductor device having a gate insulating film including a high dielectric material and a method for fabricating the same.

With the recent increase in the integration and speed of semiconductor devices, metal oxide semiconductor field effect transistors (MOSFETs) are being increasingly miniaturized. As the gate insulating film of the transistors becomes thinner and thinner along with this miniaturization, problems such as increase in gate leakage current due to a tunnel current will come to the surface. To solve this problem, it has been examined to use, as the gate insulating film, a high dielectric (high-k) film made of any of hafnium oxide ($HfO_2$), zirconium oxide ($ZrO_2$), lanthanum oxide ($La_2O_3$), titanium oxide ($TiO_2$), tantalum oxide ($Ta_2O_5$), etc. which have a dielectric constant higher than silicon oxide ($SiO_2$) and silicon nitride ($Si_3N_4$), thereby to increase the physical thickness of the gate insulating film. Incidentally, it has also been examined to use a metal gate electrode to prevent generation of a deletion layer, which is generated in a polysilicon layer when the polysilicon layer is used as the gate electrode.

In use of a metal gate electrode, the metal gate electrode must exhibit a level of work function with which an appropriate threshold voltage is secured for an n-type metal insulator semiconductor (MIS) transistor or a p-type MIS transistor, at the interface with the gate insulating film, for reduction in power consumption. In recent years, a gate insulating film containing lanthanum (La) is formed for n-type MIS transistors, and a gate insulating film containing aluminum (Al) is formed for p-type MIS transistors, to satisfy the above requirement.

A conventional method for fabricating a semiconductor device using a high-k film and a metal gate electrode will be described with reference to FIGS. 13A-13F, 14A-14F, and 15.

As shown in FIG. 13A, a p-type region 102 and an n-type region 103 are formed in an upper portion of a semiconductor substrate 101 made of silicon (Si) by ion implantation, etc. Subsequently, an element isolation film 104 as a silicon oxide film is formed in a boundary region between the p-type region 102 and the n-type region 103.

As shown in FIG. 13B, a silicon oxide ($SiO_2$) film 105A and a polysilicon film 106A are sequentially formed on the p-type region 102, the n-type region 103, and the element isolation film 104.

As shown in FIG. 13C, dummy gate insulating films 105 and dummy gate electrodes 106 are respectively formed from the $SiO_2$ film 105A and the polysilicon film 106A by etching.

As shown in FIG. 13D, using the dummy gate electrodes 106 as a mask, n-type impurity ions and p-type impurity ions are respectively implanted in the p-type region 102 and the n-type region 103, to form extension layers 107 and 108.

A shown in FIG. 13E, a silicon nitride (SiN) layer is formed to cover the semiconductor substrate 101, the dummy gate insulating films 105, and the dummy gate electrodes 106 and then etched back, to form gate sidewall insulating films 109.

As shown in FIG. 13F, using the dummy gate electrodes 106 and the gate sidewall insulating films 109 as a mask, n-type impurity ions and p-type impurity ions are respectively implanted in an upper portion of the p-type region 102 and an upper portion of the n-type region 103 and then heat-treated, to form source/drain regions 110 and 111.

As shown in FIG. 14A, silicide layers 112 and 113 made of nickel silicon (Nisi) are formed in upper portions of the source/drain regions 110 and 111 by a known silicide formation technique.

As shown in FIG. 14B, an interlayer insulating film 114 made of $SiO_2$ is formed to cover the semiconductor substrate 101, the dummy gate electrodes 106, and the gate sidewall insulating films 109, and then polished by chemical mechanical polishing (CMP), etc. until the dummy gate electrodes 106 are exposed.

As shown in FIG. 14C, the dummy gate electrodes 106 are selectively removed by dry etching, and then the dummy gate insulating films 105 are removed by wet etching, thereby forming a first gate embedding groove 115 on the p-type region 102 and a second gate embedding groove 116 on the n-type region 103.

As shown in FIG. 14D, a mask film 117 as a silicon film having a thickness of about 1 μm is formed on the interlayer insulating film 114 so as to fill the first gate embedding groove 115 therewith but not to fill the second gate embedding groove 116.

As shown in FIG. 14E, an amorphous lanthanum aluminum oxide ($LaAlO_3$) film that has a thickness of about 3 nm and a concentration ratio of Al to La of 1.5 is formed on the mask film 117 and at the bottom of the second gate embedding groove 116 that is on the n-type region 103, as a gate insulating film 118 for a p-type MIS transistor, by CVD, sputtering, or the like.

As shown in FIG. 14F, after removal of the Si mask film 117, an amorphous $LaAlO_3$ film that has a thickness of about 3 nm and a concentration ratio of Al to La of 1.0 is formed at the bottom of the first gate embedding groove 115 that is on the p-type region 102, as a gate insulating film 119 for an n-type MIS transistor, in a manner similar to that for formation of the gate insulating film 118. An Si mask film used for this formation is then removed.

As shown in FIG. 15, gate electrodes 120 and 121 made of tantalum carbide (TaC) are formed on the gate insulating films 118 and 119 by a known method, thereby to obtain a conventional semiconductor device.

In the semiconductor device fabricated by the conventional fabrication method described above, the concentration ratio of Al to La in the gate insulating film of the p-type MIS transistor is larger than that in the gate insulating film of the n-type MIS transistor, thereby to secure appropriate threshold voltages (see Japanese Patent Publication No. 2009-117557, for example).

As described above, the threshold voltage shifts in the opposite directions due to La and Al that are metals for adjusting the threshold voltage to an appropriate value. This phenomenon occurs because the polarities of the fixed charge brought about in the gate insulating film by La and Al are the opposite to each other. More specifically, for an Al-rich film, negative fixed charge occurs at the interface between the substrate and the gate insulating film, resulting in shift of the flat band voltage to the positive side, while, for a La-rich film, positive fixed charge occurs at the interface between the substrate and the gate insulating film, resulting in shift of the flat band voltage to the negative side.

With the mechanism described above, a semiconductor device having appropriate threshold voltages can be implemented by changing the concentration ratio of Al to La in the gate insulating film.

SUMMARY

In fabrication of a resistance element, a silicon film such as a polysilicon film or an amorphous silicon film is formed as the resistance layer, and use of any metal electrode material is excluded to prevent decrease in resistance. However, in the conventional method for fabricating a semiconductor device described above, since La as an adjustment metal is contained in the high-k film that is the gate insulating film, to allow the n-type MIS transistor to have an appropriate threshold voltage, La is to be contained also in the high-k film in the resistance element region. With La being easy to crystallize, if a polysilicon film is formed directly on the La-containing high-k film as the resistance layer, the film may grow abnormally with crystallized La serving as nuclei, causing a problem that the thickness of the silicon film is unstable failing to obtain a stable resistance value. This problem of the unstable silicon film will occur, not only in resistance elements, but also in fuse elements and alignment marks in the lithography process during patterning of gate electrodes, because these elements are formed to have structures similar to those of the resistance elements.

In view of the above problem, it is an objective of the present invention to allow a MIS transistor to have an appropriate threshold voltage with an adjustment metal contained in a high dielectric film of its gate insulating film, while allowing a resistance element to have a silicon film as the resistance layer that is free from abnormal growth and thus has a stable thickness because a high dielectric film underlying the resistance layer does not contain an adjustment metal easy to crystallize.

To attain the above objective, the semiconductor device of the present invention is configured so that, while a MIS transistor has a gate insulating film including a high dielectric film that contains an adjustment metal, a resistance element has a resistance layer made of a silicon film formed on, and in contact with, a high dielectric film that does not contain an adjustment metal easy to crystallize.

Specifically, the semiconductor device of the present invention includes: a first MIS transistor of a first conductivity type having a first active region as a region of a semiconductor substrate surrounded by an element isolation region formed in an upper portion of the semiconductor substrate, a first gate insulating film having a first high dielectric film formed on the first active region, and a first gate electrode formed on the first gate insulating film; and a resistance element having a second high dielectric film formed on the element isolation region and a resistance layer made of silicon formed on the second high dielectric film, wherein the first high dielectric film and the second high dielectric film include a same high dielectric material, and the first high dielectric film includes a first adjustment metal, but the second high dielectric film does not include the first adjustment metal.

According to the semiconductor device of the present invention, it is possible to allow the transistor to have an appropriate threshold voltage, and also prevent the silicon film used as the resistance layer of the resistance element from growing abnormally, thereby to permit stabilization of the thickness of the resistance layer.

Preferably, the first gate electrode is formed on, and in contact with, the first high dielectric film of the first gate insulating film, and the resistance layer is formed on, and in contact with, the second high dielectric film.

The resistance layer may be formed only above the element isolation region.

The semiconductor device of the present invention may further includes a protective insulating film formed on the resistance layer, wherein the protective insulating film is not formed above the first active region including the first gate electrode.

Preferably, the first gate electrode includes a first metal film formed on the first gate insulating film and a first silicon film formed on the first metal film.

Preferably, the first gate insulating film includes a first underlying insulating film formed on the first active region and the first high dielectric film formed on the first underlying insulating film.

The semiconductor device of the present invention may further include: first sidewall insulating films formed on the side faces of the first gate insulating film and the first gate electrode; and second sidewall insulating films formed on the side faces of the second high dielectric film and the resistance layer.

The semiconductor device of the present invention may further include a silicide layer formed on the first gate electrode.

The first adjustment metal may be a metal with which silicon grows abnormally.

Preferably, the first MIS transistor is an n-type MIS transistor, the resistance layer is made of n-type silicon, and the first adjustment metal is lanthanum.

The semiconductor device of the present invention may further include a second MIS transistor of a second conductivity type having a second active region as a region of the semiconductor substrate surrounded by the element isolation region formed in an upper portion of the semiconductor substrate, a second gate insulating film having a third high dielectric film formed on the second active region, and a second gate electrode formed on the second gate insulating film, wherein the third high dielectric film includes the same high dielectric material as the first high dielectric film and the second high dielectric film, and includes a second adjustment metal, but does not include the first adjustment metal.

Preferably, the second high dielectric film includes the second adjustment metal.

Preferably, the second gate insulating film includes a second underlying insulating film formed on the second active region, the third high dielectric film formed on the second underlying insulating film, and a second adjustment metal-containing film containing the second adjustment metal formed on the third high dielectric film.

Preferably, the second gate electrode includes a second metal film formed on the second gate insulating film and a second silicon film formed on the second metal film.

Preferably, the second MIS transistor is a p-type MIS transistor, and the second adjustment metal is aluminum.

Preferably, the second high dielectric film is formed on the element isolation region via a third underlying insulating film.

Preferably, the second high dielectric film is formed on, and in contact with, the element isolation region.

The method for fabricating a semiconductor device of the present invention includes the steps of: (a) forming a first active region as a region of a semiconductor substrate surrounded by an element isolation region in an upper portion of the semiconductor substrate; (b) forming a high dielectric film on the semiconductor substrate after the step (a); (c) introducing a first adjustment metal selectively in a portion of the high dielectric film located on the first active region, to form a first high dielectric film containing the first adjustment metal on the first active region, while forming a second high dielectric film containing no first adjustment metal on the element isolation region; (d) forming a metal film on the first high dielectric film and the second high dielectric film; (e) removing a portion of the metal film on the second high dielectric film while leaving a portion of the metal film on the first high dielectric film unremoved; (f) forming a silicon film on the metal film and the second high dielectric film after the step (e); and (g) patterning the silicon film, the metal film, the first high dielectric film, and the second high dielectric film, to form a first gate insulating film including the first high dielectric film on the first active region and a first gate electrode including the metal film and the silicon film, and also form a resistance layer made of the silicon film on the element isolation region via the second high dielectric film.

Preferably, the step (a) includes the step of forming a second active region as a region of the semiconductor substrate surrounded by the element isolation region in an upper portion of the semiconductor substrate, the method further includes, after the step (b) and before the step (c), the step (g) of forming a second adjustment metal-containing film containing a second adjustment metal on a portion of the high dielectric film located on the second active region, the step (c) includes the step of forming a third high dielectric film containing no first adjustment metal on the second active region, the step (d) includes the step of forming the metal film on the third high dielectric film via the second adjustment metal-containing film, the step (e) includes the step of leaving a portion of the metal film on the third high dielectric film unremoved, and the step (g) includes the step of patterning the silicon film, the metal film, the second adjustment metal-containing film, and the third high dielectric film, to form a second gate insulating film including the third high dielectric film and the second adjustment metal-containing film on the second active region and a second gate electrode including the metal film and the silicon film.

Preferably, an n-type MIS transistor having the first gate insulating film and the first gate electrode is formed on the first active region, a resistance element having the resistance layer is formed on the element isolation region, and lanthanum is used as the first adjustment metal.

As described above, in the semiconductor device and the method for fabricating the same of the present invention, it is possible to allow the transistors to have their appropriate threshold voltages, and also prevent the silicon film used as the resistance layer of the resistance clement from growing abnormally, permitting stabilization of the thickness of the resistance layer.

BRIEF DESCRIPTION OF THE DRAWINGS

FIGS. 9A-9C are step-by-step cross-sectional views showing the fabrication method of the second example embodiment.

DETAILED DESCRIPTION (First Example Embodiment)

Figure 1:
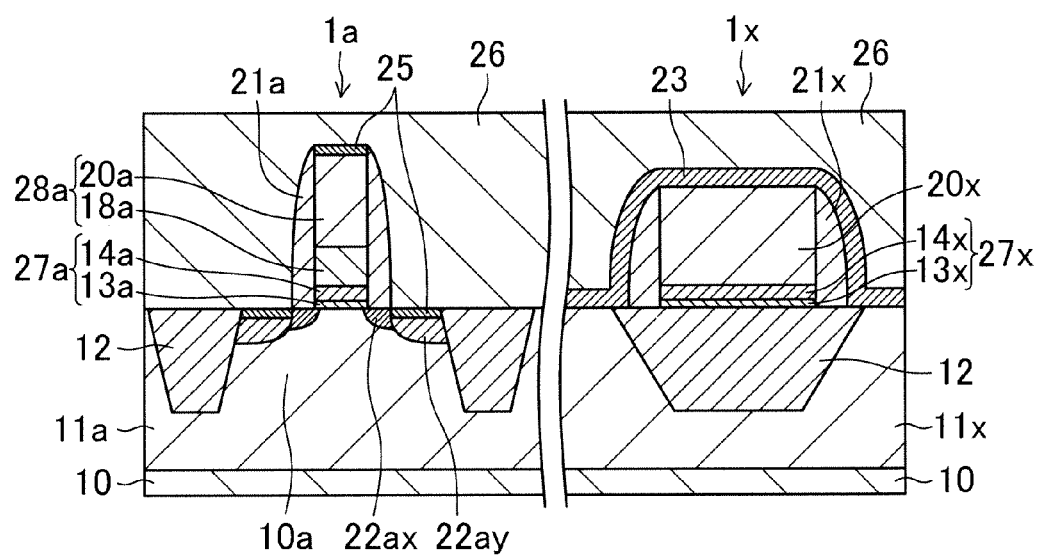
FIG. 1 is a cross-sectional view of a semiconductor device of the first example embodiment.

A semiconductor device and a method for fabricating the same of the first example embodiment will be described with reference to FIGS. 1, 2A-2C, 3A-3C, 4A-4C, 5A-5C, 6A, and 6B. FIG. 1 is a cross-sectional view of the semiconductor device of the first example embodiment. FIGS. 2A-6B are cross-sectional views illustrating the method for fabricating the semiconductor device of the first example embodiment in the sequence of the steps that are performed. It should be noted that, throughout the drawings, an n-type MIS transistor region 1a in which an n-type MIS transistor is to be formed is shown on the left, and a resistance element region 1x in which an n-type resistance element is to be formed is shown on the right. The n-type MIS transistor region 1a and the resistance element region 1x share the same semiconductor substrate.

First, the structure of the semiconductor device of the first example embodiment will be described with reference to FIG. 1.

As shown in FIG. 1, the n-type MIS transistor includes: a p-type region 11a including a p-type well, etc. formed in an upper portion of a semiconductor substrate 10 in the n-type MIS transistor region 1a; element isolation regions 12 formed in upper portions of the p-type region 11a; an active region 10a as a portion of the semiconductor substrate 10 surrounded by the element isolation regions 12; a gate insulating film 27a formed on the active region 10a; a gate electrode 28a formed on the gate insulating film 27a; and sidewall insulating films 21a formed on the side faces of the gate electrode 28a and the gate insulating film 27a. The n-type MIS transistor further includes: shallow n-type source/drain regions (extension regions) 22ax formed in portions of the active region 10a under the sides of the gate electrode 28a: deep n-type source/drain regions 22ay formed in portions of the active region 10a under the outer sides of the sidewall insulating films 21a; silicide layers 25 formed on the gate electrode 28a (silicon film 20a) and the deep n-type source/drain regions 22ay; and an interlayer insulating film 26 formed above the active region 10a to cover the gate electrode 28a and the sidewall insulating films 21a. The gate insulating film 27a is comprised of an underlying insulating film 13a made of silicon oxide or silicon oxynitride formed on the active region 10a and a La-containing high dielectric film 14a containing La that serves as the adjustment metal for the n-type MIS transistor, formed on the underlying insulating film 13a. As the adjustment metal for the n-type MIS transistor, which is a metal added to the high dielectric film to reduce the effective work function of the n-type MIS transistor, elements other than La, such as the elements of the lanthanoid series other than La, scandium (Sc), strontium (Sr), and magnesium (Mg) may be used. With addition of such an element, the effective work function of the n-type MIS transistor can be reduced compared with the case without addition of such an adjustment metal. The gate electrode 28a is comprised of a metal film 18a made of titanium nitride (TiN) formed on the gate insulating film 27a and a silicon film 20a made of n-type polysilicon formed on the metal film 18a.

The resistance element includes: a p-type region 11x including a p-type well, etc. formed in an upper portion of the semiconductor substrate 10 in the resistance element region 1x; an element isolation region 12 formed in an upper portion of the p-type region 11x; a lower insulating film 27x formed on the element isolation region 12; a resistance layer made of n-type polysilicon formed on, and in contact with, the lower insulating film 27x; sidewall insulating films 21x formed on the side faces of the resistance layer 20x and the lower insulating film 27x: a protective insulating film 23 made of silicon oxide formed to cover the resistance layer 20x and the sidewall insulating films 21x; and the interlayer insulating film 26 formed on the protective insulating film 23. The lower insulating film 27x is comprised of an underlying insulating film 13x made of silicon oxide or silicon oxynitride formed on the element isolation region 12 and a La-free high dielectric film 14x containing no La formed on the underlying insulating film 13x. The La-free high dielectric film 14x is made of the same high dielectric material (e.g., a hafnium oxide) as the La-containing high dielectric film 14a but does not contain La as the adjustment metal unlike the La-containing high dielectric film 14a. Note that, as the lower insulating film 27x, formation of the underlying insulating film 13x is not necessarily required, but only the La-free high dielectric film 14x may be formed. Note also that it is not necessarily required to form the p-type region 11x in the semiconductor substrate 10 in the resistance element region 1x.

In the semiconductor device of the first example embodiment, having the adjustment metal (La) contained in the La-containing high dielectric film 14a of the gate insulating film 27a of the n-type MIS transistor, the effective work function of the n-type MIS transistor can be reduced, and thus an appropriate threshold voltage can be secured. Also, having no adjustment metal (La) contained in the La-free high dielectric film 14x of the lower insulating film 27x of the resistance element, the resistance layer 20x made of polysilicon formed on, and in contact with, the La-free high dielectric film 14x is prevented from growing abnormally, and thus a stable resistance value can be obtained.

A method for fabricating the semiconductor device of the first example embodiment will be described with reference to FIGS. 2A-6B.

In this embodiment, the case of forming an n-type resistance element together with formation of an n-type MIS transistor will be described. The n-type MIS transistor region 1a and the resistance element region 1x share the same semiconductor substrate.

Figure 2A:
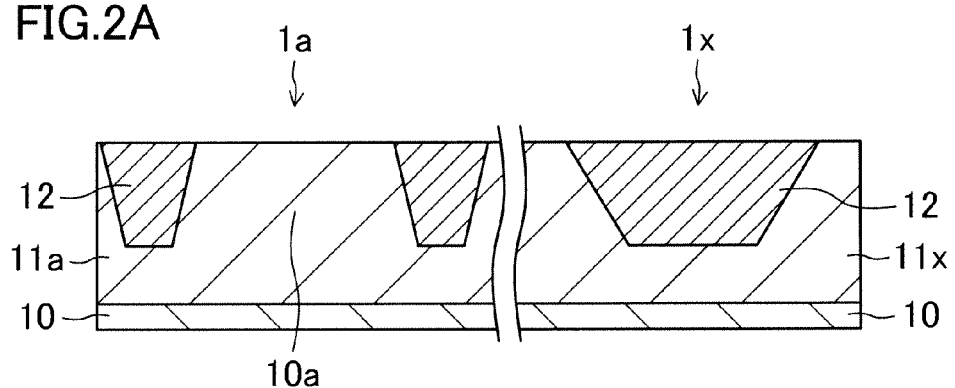
FIGS. 2A-2C are step-by-step cross-sectional views showing a method for fabricating the semiconductor device of the first example embodiment.

First, as shown in FIG. 2A, trenches having a depth of about 300 nm are formed in an upper portion of the semiconductor substrate 10 made of silicon, and then the element isolation regions 12 are formed by shallow trench isolation (STI) where the trenches are filled with an isolation insulating film made of silicon oxide, etc. using chemical vapor deposition (CVD), chemical mechanical polishing (CMP), etc. By this isolation, the active region 10a is defined as a region surrounded by the element isolation regions 12 in the semiconductor substrate 10 in the n-type MIS transistor region 1a. Thereafter, the p-type regions 11a and 11x each including a p-type well larger in diffusion depth than the element isolation regions 12 are formed in an upper portion of the semiconductor substrate 10 by ion implantation, etc. Note that it is not necessarily required to form the p-type region 11x in the semiconductor substrate 10 in the resistance element region 1x. A p-type impurity layer (not shown) for threshold voltage control is then formed in an upper portion of the p-type region 11a in the n-type MIS transistor region 1a.

Figure 2B:
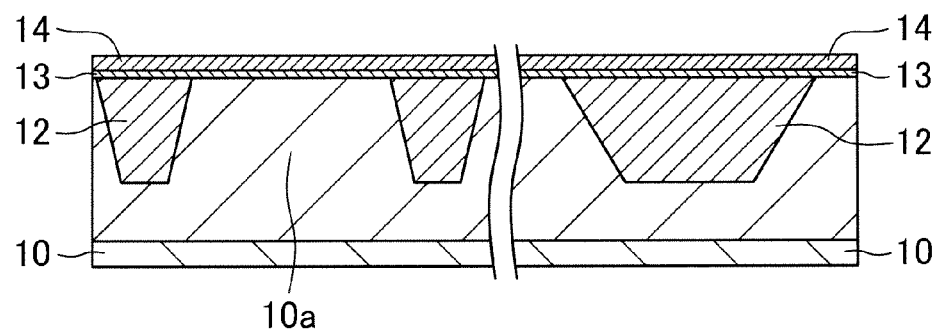

As shown in FIG. 2B, the underlying insulating film 13 made of silicon oxide or silicon oxynitride and the high dielectric film 14 having a thickness of about 2 nm are sequentially formed on the semiconductor substrate 10. The formation of the underlying insulating film 13 is necessary only at least between the active region 10a and the high dielectric film 14, and is not necessarily required on the element isolation regions 12. For example, in formation of a silicon oxide film having a thickness of 1 nm or less as the underlying insulating film 13 by rapid thermal oxidation (RTO), etc., the silicon oxide film is selectively formed on the active layer 10a of the semiconductor substrate 10 where silicon is exposed, but is not formed on the element isolation regions 12 where no silicon is exposed. Therefore, with no formation of the underlying insulating film 13 made of silicon oxide on the element isolation regions 12 the high dielectric film 14 is to be formed directly on the element isolation regions 12. The high dielectric film 14 may be made of any of oxides, oxynitrides, silicates, and nitrogen-containing silicates of metals having a dielectric constant of 10 or more, such as hafnium (Hf), zirconium (Zr), and yttrium (Y). Specific examples include hafnium silicate (HfSiO), hafnium silicate nitride (HfSiON), hafnium oxide (HfO$_2$), hafnium aluminum oxide (HfAlO$_x$), zirconium oxide (ZrO$_2$), and yttrium oxide (Y$_2$O$_3$). Films made of such materials can be formed by atomic layer deposition (ALD), chemical vapor deposition (CVD), physical vapor deposition (PVD), etc.

Figure 2C:
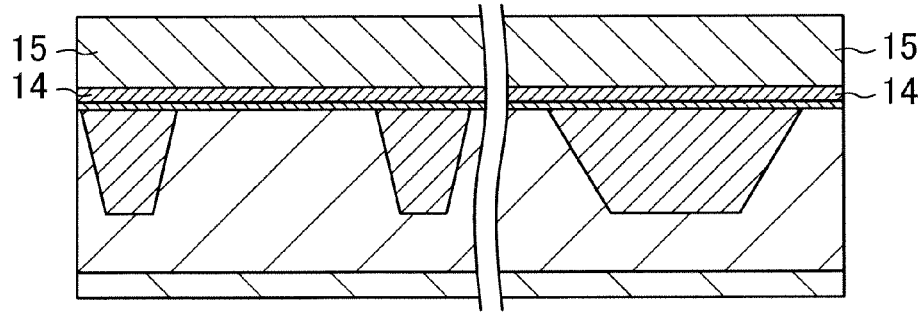

As shown in FIG. 2C, a metal mask film 15 is formed on the high dielectric film 14. As the metal mask film 15, a TiN film, for example, may be formed to a thickness of about 10 nm by ALD, CVD, PVD, etc.

Figure 3A:
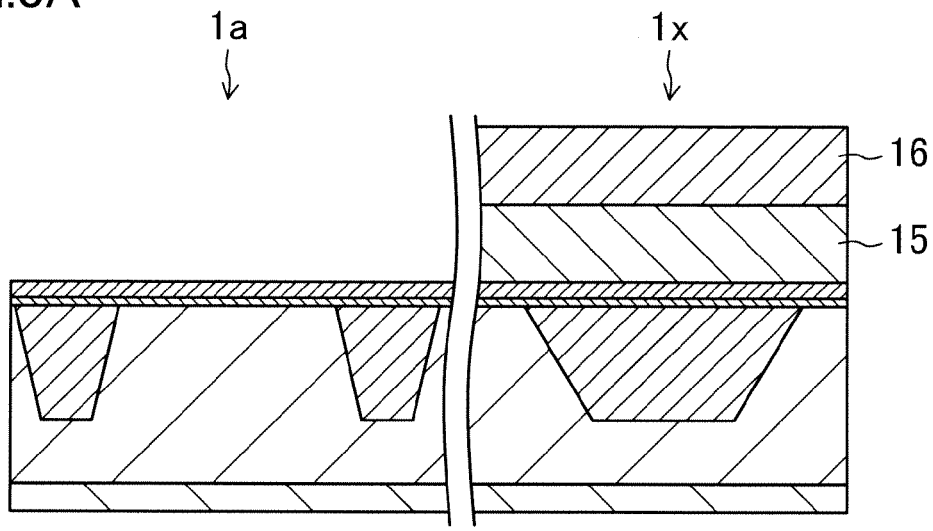
FIGS. 3A-3C are step-by-step cross-sectional views showing the fabrication method of the first example embodiment.

As shown in FIG. 3A, a resist film 16 having an opening in the n-type MIS transistor region 1a and covering the resistance element region 1x is formed on the metal mask film 15. Using the resist film 16 as a mask, the portion of the metal mask film 15 in the n-type MIS transistor region 1a is removed while the portion thereof in the resistance element region 1x is left unremoved.

Figure 3B:
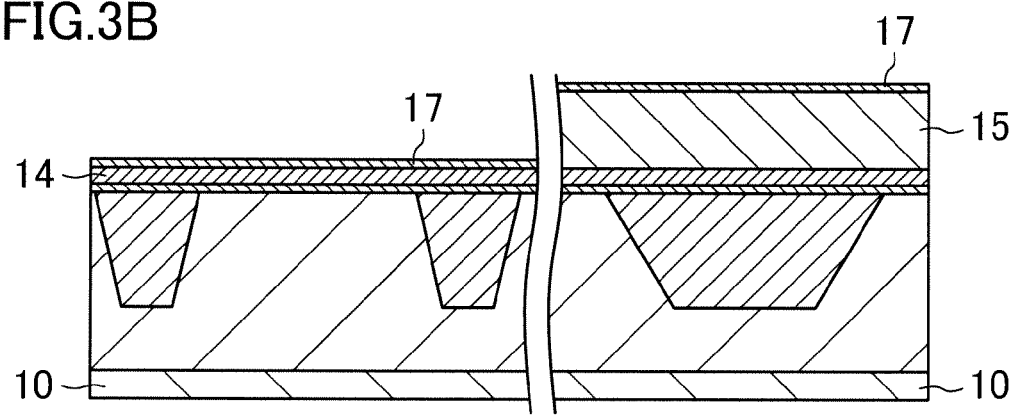

As shown in FIG. 3B, after removal of the resist film 16 by a known aching method, etc a La-containing film 17 made of lanthanum oxide (La$_x$O$_y$), for example, which includes La as the adjustment metal for the n-type MIS transistor, is formed on the entire surface of the semiconductor substrate 10 by sputtering, for example. As a result, while the La-containing film 17 is directly formed on the high dielectric film 14 in the n-type MIS transistor region 1a, it is not directly formed on the high dielectric film 14 in the resistance element region 1x but formed on the metal mask film 15.

Figure 3C:
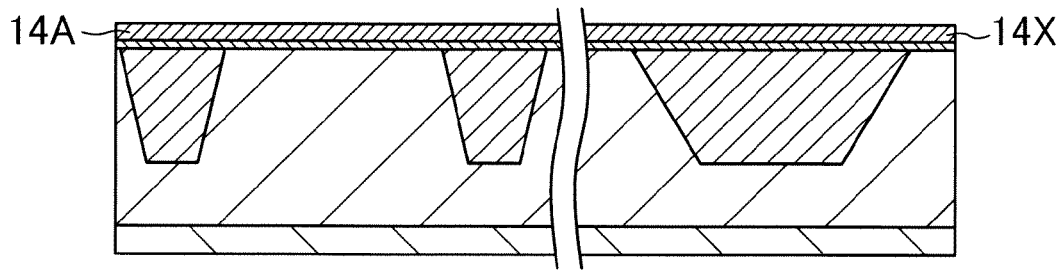

As shown in FIG. 3C, annealing is performed at 700° C. for 120 minutes, for example, to allow La as the adjustment metal to be diffused from the La-containing film 17 into only the portion of the high dielectric film 14 in the n-type MIS transistor region 1a, to form a La-containing high dielectric film 14A. At this time, no La is diffused into the portion of the high dielectric film 14 in the resistance element region 1x with the metal mask film 15 serving as a diffusion prevention film, leaving intact the high dielectric film 14 as a La-free high dielectric film 14X. The remaining La-containing film 17 and the metal mask film 15 are then removed.

Figure 4A:
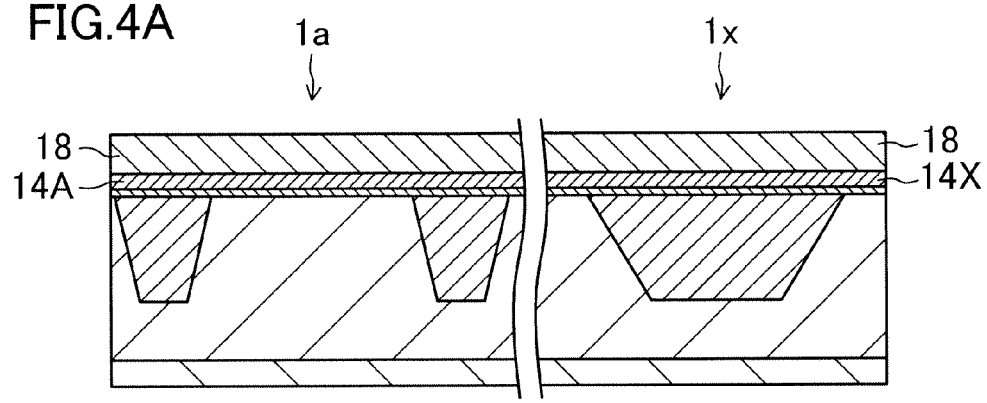
FIGS. 4A-4C are step-by-step cross-sectional views showing the fabrication method of the first example embodiment.

As shown in FIG. 4A, a metal film 18 that is to be part of the gate electrode is formed on the La-containing high dielectric film 14A and the La-free high dielectric film 14X. As the metal film 18, a TiN film having a thickness of about 15 nm may be formed by ALD, CVD, PVD, etc.

Figure 4B:
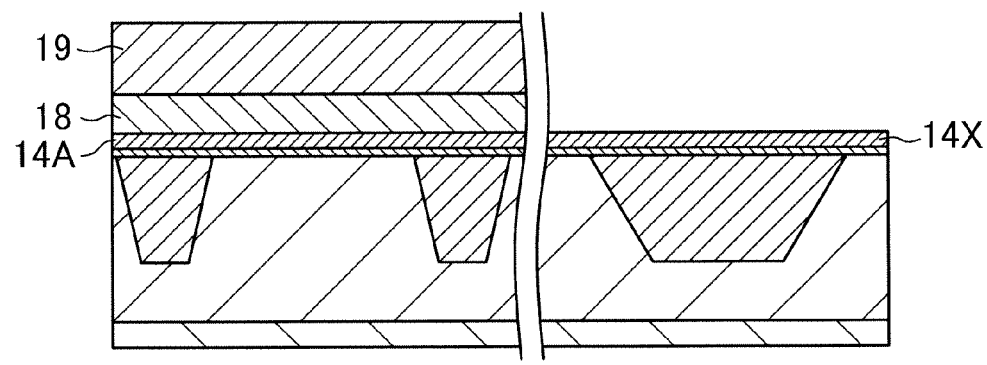

As shown in FIG. 4B, a resist film 19 having an opening in the resistance element region 1x and covering the n-type MIS transistor region 1a is formed on the metal film 18. Using the resist film 19 as a mask, the portion of the metal film 18 in the resistance element region 1x is removed by wet etching or dry etching. Thus, while the metal film 18 remains unremoved on the La-containing high dielectric film 14A in the n-type MIS transistor region 1a, it does not exist on the La-free high dielectric film 14X in the resistance element region 1x.

Figure 4C:
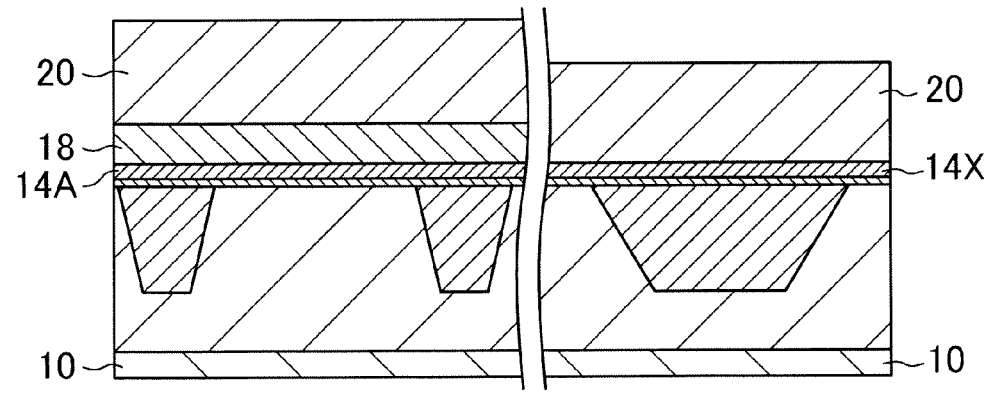

As shown in FIG. 4C, after removal of the resist film 19 by a known ashing method, etc., a silicon film 20 made of polysilicon having a thickness of about 100 nm is formed on the entire surface of the semiconductor substrate 10 by CVD, for example. Thus, while the silicon film 20 is formed on the La-containing high dielectric film 14A via the metal film 18 in the n-type MIS transistor region 1a, it is directly formed on the La-free high dielectric film 14X in the resistance element region 1x.

Figure 5A:
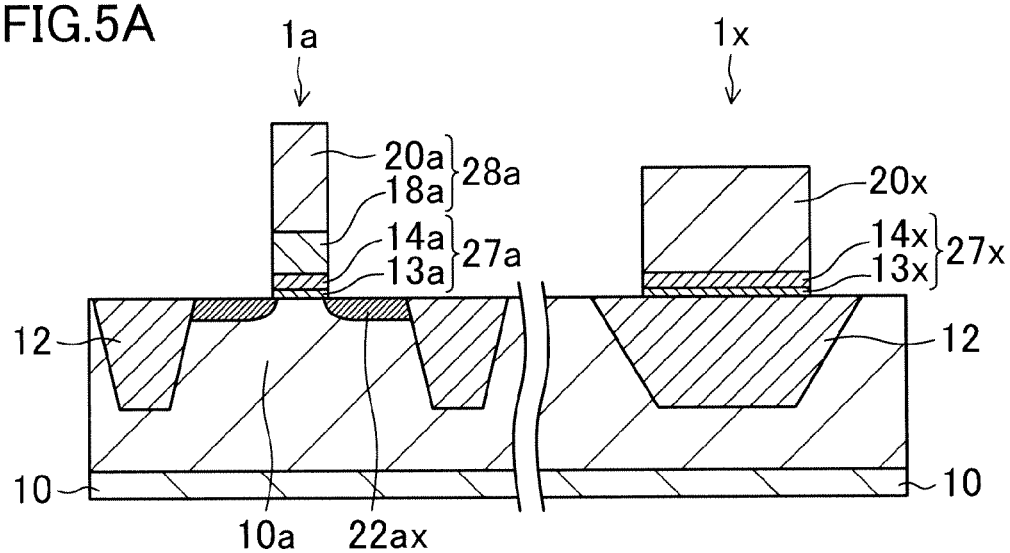
FIGS. 5A-5C are step-by-step cross-sectional views showing the fabrication method of the first example embodiment.

As shown in FIG. 5A, a resist film (not shown) having a gate electrode pattern and a resistance element pattern is formed on the silicon film 20 by lithography. Using the resist film as a mask, the silicon film 20, the metal film 18, the La-containing high dielectric film 14A, the La-free high dielectric film 14X, and the underlying insulating film 13 are sequentially patterned by dry etching, and then the resist film is removed. As a result, in the n-type MIS transistor region 1a, formed on the active region 10a are the gate insulating film 27a comprised of the underlying insulating film 13a and the La-containing high dielectric film 14a and the gate electrode 28a comprised of the metal film 18a and the silicon film 20a. In the resistance element region 1x, formed are the lower insulating film 27x comprised of the underlying insulating film 13x and the La-free high dielectric film 14x and the resistance layer 20x. Since the resistance layer 20x of the resistance element is formed above the element isolation region 12, the substrate is prevented from being etched during the patterning. Thereafter, using the gate electrode 28a as a mask, an n-type impurity is implanted in the active region 10a by ion implantation, to form the shallow n-type source/drain regions 22ax in portions of the active region 10a under the sides of the gate electrode 28a in a self-aligned manner. At this time, the n-type impurity is also implanted in the resistance layer 20x to form the n-type resistance layer 20x.

Figure 5B:
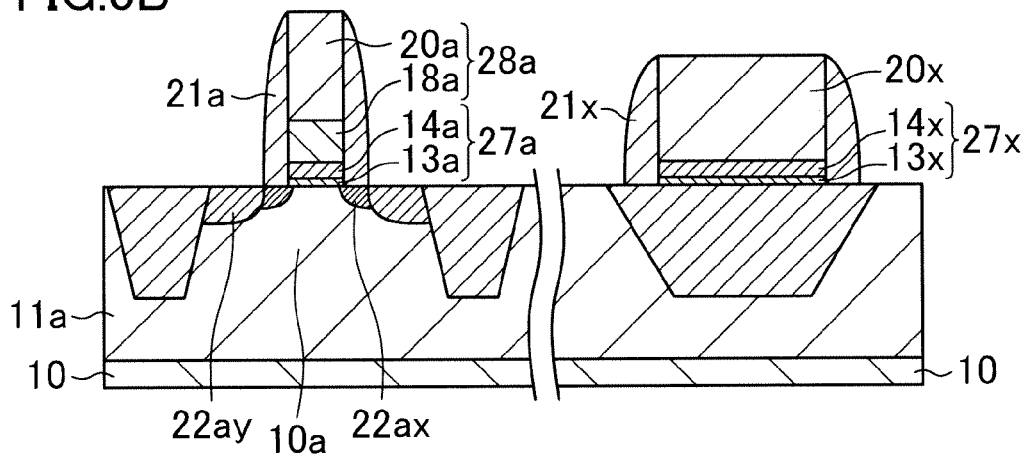

As shown in FIG. 5B an insulating film is formed on the entire surface of the semiconductor substrate 10 and then etched back, to form the sidewall insulating films 21a on the side faces of the gate electrode 28a and the gate insulating film 27a and also form the sidewall insulating films 21x on the side faces of the resistance layer 20x and the lower insulating film 27x. The sidewall insulating films 21a and 21x may be a single-layer film or a multilayer film made of silicon oxide or silicon nitride. For example, each of the sidewall insulating films 21a and 21x may be comprised of an inner sidewall made of silicon oxide having an L-shaped cross section formed on the side face of the gate electrode 28a or the resistance layer 20x and an outer sidewall made of silicon nitride formed on the inner side wall. Thereafter, using the gate electrode 28a and the sidewall insulating films 21a as a mask, an n-type impurity is implanted in the active region 10a by ion implantation, to form the deep n-type source/drain regions 22ay in portions of the active region 10a under the outer sides of the sidewall insulating films 21a in a self-aligned manner. At this time, the n-type impurity is also implanted in the resistance layer 20x to form the n-type resistance layer 20x. Note that, although ion implantation is performed for the resistance layer 20x twice at the formation of the shallow n-type source/drain regions 22ax and the formation of the deep n-type source/drain regions 22ay in this embodiment, it may be performed only once at either occasion. Otherwise, no ion implantation may be performed at such occasions, but separate ion implantation of an n-type impurity may be performed.

Figure 5C:
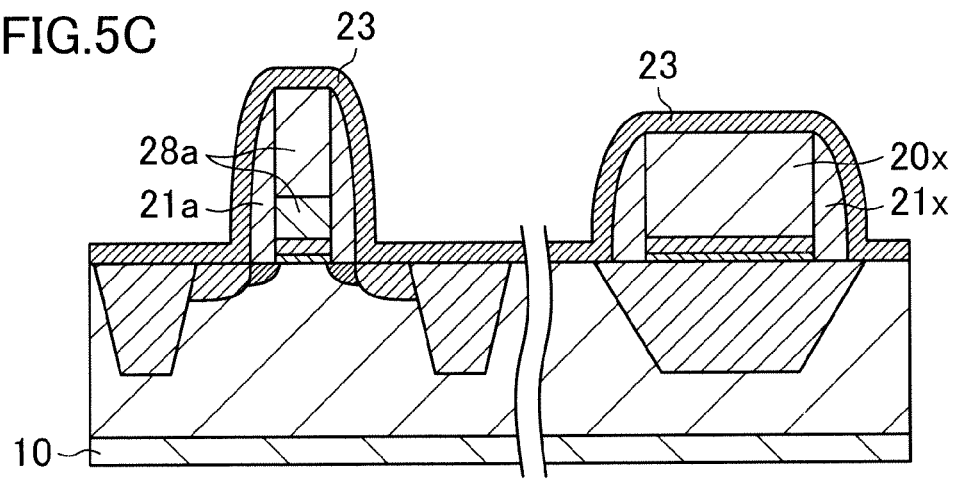

As shown in FIG. 5C, the protective insulating film 23 made of silicon oxide is formed on the entire surface of the semiconductor substrate 10 by CVD, for example, to cover the gate electrode 28a, the resistance film 20x, and the sidewall insulating films 21a and 21x.

Figure 6A:
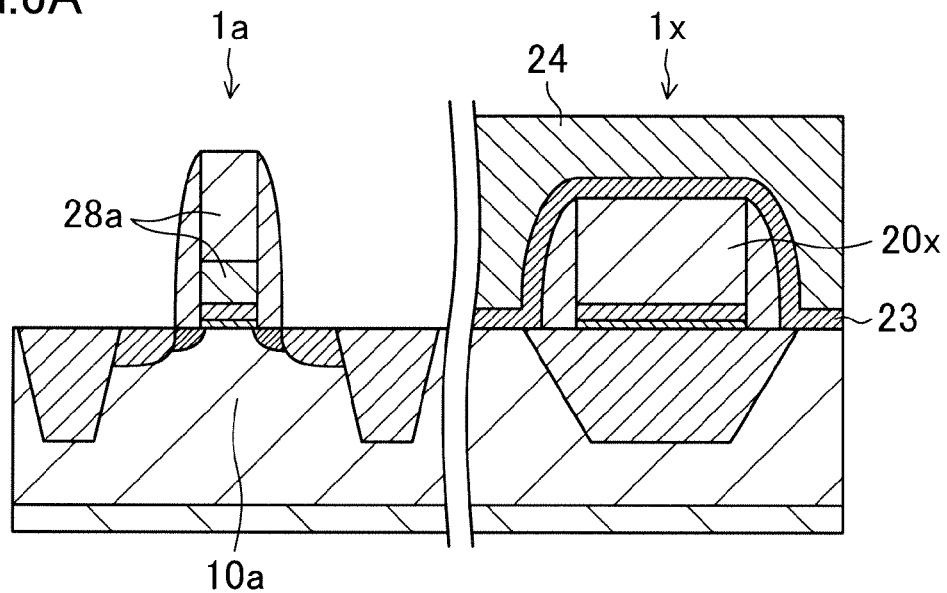
FIGS. 6A and 6B are step-by-step cross-sectional views showing the fabrication method of the first example embodiment.

As shown in FIG. 6A, on the protective insulating film 23, formed is a resist film 24 having an opening above the active region 10a in the n-type MIS transistor region 1a that is a silicide formation region and covering the resistance element region Ix that is a non-silicide formation region. Using the resist film 24 as a mask, the portion of the protective insulating film 23 in the silicide formation region is removed by wet etching. Thus. while the protective insulating film 23 does not exist above the active region 10a including the gate electrode 28a, it remains unremoved in the resistance element region 1x covering the top of the resistance layer 20x.

Figure 6B:
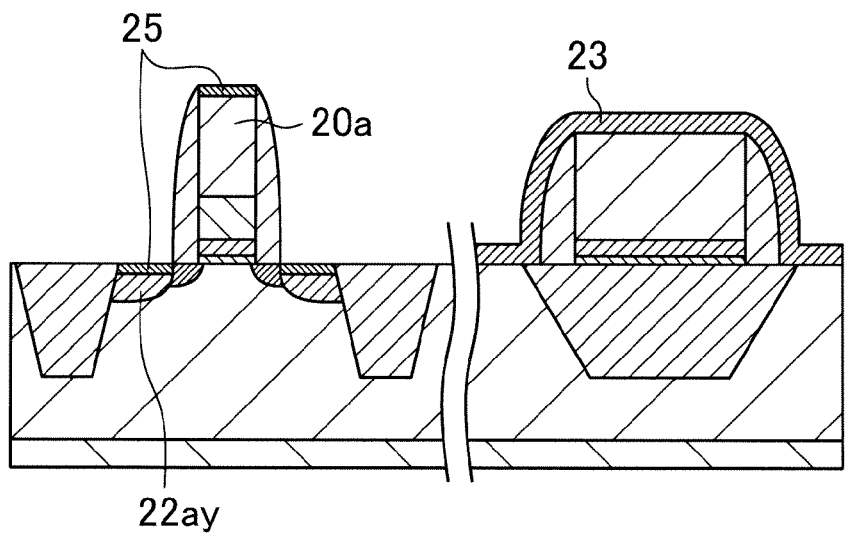

As shown in FIG. 6B, after removal of the resist film 24 by a known ashing method, etc., the silicide layers 25 are formed in an upper portion of the silicon film 20a of the gate electrode 28a and upper portions of the deep n-type source/drain regions 22ay by a known technique of forming silicide in a self-aligned manner, called a salicide technique. Although not shown, in the resistance element region 1x, a portion of the protective insulating film 23 corresponding to a contact formation region of the resistance layer 20x may be removed to form a silicide layer.

Thereafter, as shown in FIG. 1, the interlayer insulating film 26 is formed on the semiconductor substrate 10 to cover the active region 10a including the gate electrode 28a and the resistance layer 20x. The process then proceeds to steps of forming contact plugs and interconnects, which are according to a general method for fabricating a semiconductor device, and thus description of such steps is omitted here.

According to the method for fabricating a semiconductor device of the first example embodiment, since La serving as the adjustment metal is contained in the La-containing high dielectric film 14a of the gate insulating film 27a of the n-type MIS transistor, an appropriate threshold voltage can be secured. Also, since La that may cause abnormal growth is not contained in the La-free high dielectric film 14x of the lower insulating film 27x of the resistance element, the resistance layer 20x made of silicon formed on the La-free high dielectric film 14x is prevented from growing abnormally. Thus, a semiconductor device capable of obtaining a stable resistance value can be implemented.

(Second Example Embodiment)

A semiconductor device and a method for fabricating the same of the second example embodiment will be described with reference to FIGS. 7, 8A-8C, 9A-9C, 10A-10C, 11A-11C, and 12A-12C. Note that the semiconductor device and its fabrication method of the second example embodiment will be described with particular emphasis on points different from those of the first example embodiment, omitting common points as appropriate.

Figure 7:
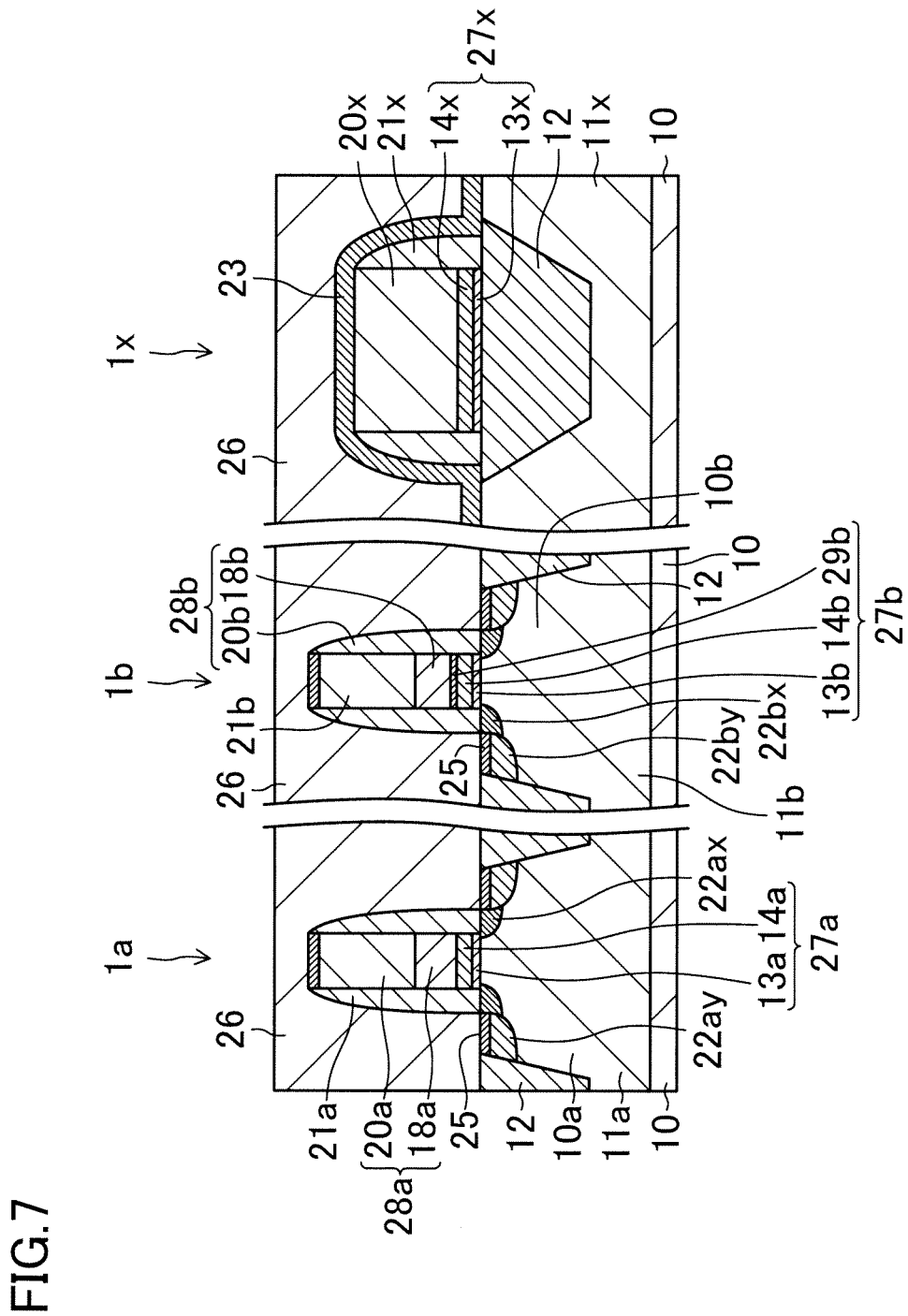
FIG. 7 is a cross-sectional view of a semiconductor device of the second example embodiment.

FIG. 7 is a cross-sectional view of the semiconductor device of the second example embodiment. FIGS. 8A-12C are cross-sectional views of the method for fabricating the semiconductor device of the second example embodiment in the sequence of the steps that are performed. It should be noted that, throughout the drawings, an n-type MIS transistor region 1a in which an n-type MIS transistor is to be formed is shown on the left, a p-type MIS transistor region 1b in which a p-type MIS transistor is to be formed is shown in the center, and a resistance element region 1x in which an n-type resistance element is to be formed is shown on the right. The n-type MIS transistor region 1a, the p-type MIS transistor region 1b, and the resistance element region 1x share the same semiconductor substrate. Note that in FIGS. 7 and 8A-12C, the same components as those in the first example embodiment are denoted by the same reference characters as those shown in FIGS. 1 and 2A-6B in the first example embodiment.

First, the structure of the semiconductor device of the second example embodiment will be described with reference to FIG. 7.

The n-type MIS transistor formed in the n-type MIS transistor region 1a and the resistance element formed in the resistance element region 1x are respectively the same in configuration as the n-type MIS transistor and the resistance element shown in FIG. 1 in the first example embodiment, and thus description thereof is omitted here.

As shown in FIG. 7, the p-type MIS transistor includes: an n-type region 11b including an n-type well, etc. formed in an upper portion of the semiconductor substrate 10 in the p-type MIS transistor region 1b; element isolation regions 12 formed in upper portions of the n-type region 11b; an active region 10b as a portion of the semiconductor substrate 10 surrounded by the element isolation regions 12; a gate insulating film 27b formed on the active region 10b; a gate electrode 28b formed on the gate insulating film 27b; and sidewall insulating films 21b formed on the side faces of the gate electrode 28b and the gate insulating film 27b. The p-type MIS transistor further includes: shallow p-type source/drain regions (extension regions) 22bx formed in portions of the active region 10b under the sides of the gate electrode 28b: deep p-type source/drain regions 22by formed in portions of the active region 10b under the outer sides of the sidewall insulating films 21b; silicide layers 25 formed on the gate electrode 28b (silicon film 20b) and the deep p-type source/drain regions 22by; and the interlayer insulating film 26 formed on the active region 10b to cover the gate electrode 28b and the sidewall insulating films 21b.

The gate insulating film 27b is comprised of an underlying insulating film 13b made of silicon oxide or silicon oxynitride formed on the active region 10b an Al-containing high dielectric film 14b containing Al that serves as the adjustment metal for the p-type MIS transistor, formed on the underlying insulating film 13b, and an Al-containing film 29b made of aluminum oxide ($Al_xO_y$) containing Al serving as the adjustment metal, formed on the Al-containing high dielectric film 14b. The adjustment metal for the p-type MIS transistor, which is a metal added to the high dielectric film to increase the effective work function of the p-type MIS transistor, is not limited to Al. With addition of such an element, the effective work function of the p-type MIS transistor can be increased compared with the case without addition of such an adjustment metal.

The gate electrode 28b is comprised of a metal film 18b made of titanium nitride (TiN) formed on the gate insulating film 27b and a silicon film 20b made of p-type polysilicon formed on the metal film 18b. The Al-containing high dielectric film 14b does not contain La that is the adjustment metal for the n-type MIS transistor. It is not necessarily required to leave the Al-containing film 29b behind, but is enough to have only the Al-containing high dielectric film 14b. Otherwise, the Al-containing high dielectric film 14b and the Al-containing film 29b may be merged with each other to form one Al-containing high dielectric film 14b. In this case, with no boundary between the Al-containing high dielectric film 14b and the Al-containing film 29b, the resultant Al-containing high dielectric film 14b will be higher in Al concentration in its upper portion (close to the gate electrode 28b) than in its lower portion (close to the underlying insulating film 13b).

In the semiconductor device of the second example embodiment, La as the adjustment metal for the n-type MIS transistor is contained in the La-containing high dielectric film 14a of the gate insulating film 27a of the n-type MIS transistor, and Al as the adjustment metal for the p-type MIS transistor is contained in the Al-containing high dielectric film 14b of the gate insulating film 27b of the p-type MIS transistor. Thus, appropriate threshold voltages for the respective transistors can be secured. Also, since La that may cause abnormal growth is not contained in the La-free high dielectric film 14x of the lower insulating film 27x of the resistance element, the resistance layer 20x made of silicon formed on, and in contact with, the La-free high dielectric film 14x is prevented from growing abnormally. Thus, a semiconductor device capable of obtaining a stable resistance value can be implemented. Note that no particular problem will arise with Al, as the adjustment metal for the p-type MIS transistor, contained in the La-free high dielectric film 14x because, unlike the case of La, no abnormal growth of the silicon film will occur with Al.

A method for fabricating the semiconductor device of the second example embodiment will be described with reference to FIGS. 8A-12C.

In this embodiment, the case of forming an n-type resistance element together with an n-type MIS transistor and a p-type MIS transistor will be described. The n-type MIS transistor region 1a, the p-type MIS transistor region 1b, and the resistance element region 1x share the same semiconductor substrate.

Figure 8A:
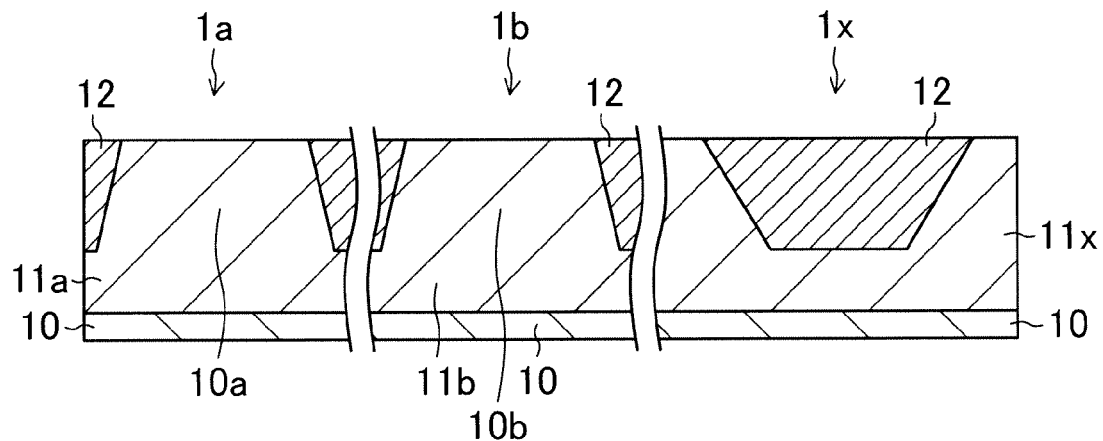
FIGS. 8A-8C are step-by-step cross-sectional views showing a method for fabricating the semiconductor device of the second example embodiment.

First, as shown in FIG. 8A, the element isolation regions 12 made of silicon are formed in an upper portion of the semiconductor substrate 10 by STI. By this isolation, the active region 10a is defined as a region surrounded by the element isolation regions 12 in the semiconductor substrate 10 in the n-type MIS transistor region 1a. Likewise, the active region 10b is defined as a region surrounded by the element isolation regions 12 in the semiconductor substrate 10 in the p-type MIS transistor region 1b. Thereafter, the p-type regions 11a and 11x each including a p-type well larger in diffusion depth than the element isolation regions 12 are formed in upper portions of the semiconductor substrate 10 in the n-type MIS transistor region 1a and the resistance element region 1x by ion implantation, etc. Note that it is not necessarily required to form the p-type region 11x in the semiconductor substrate 10 in the resistance element region 1x. Likewise, the n-type region 11b including an n-type well larger in diffusion depth than the element isolation regions 12 is formed in an upper portion of the semiconductor substrate 10 in the p-type MIS transistor region 1b by ion implantation, etc. A p-type impurity layer (not shown) for threshold voltage control is then formed in an upper portion of the p-type region 11a in the n-type MIS transistor region 1a, and an n-type impurity layer (not shown) for threshold voltage control is formed in an upper portion of the n-type region 11b in the p-type MIS transistor region 1b.

Figure 8B:
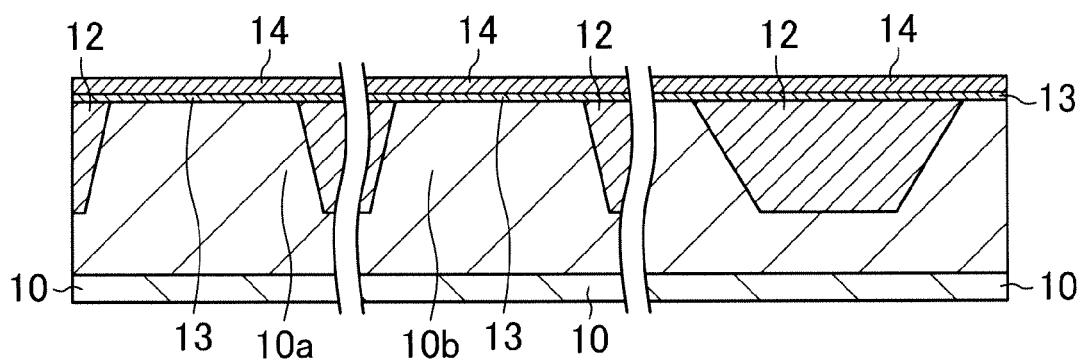

As shown in FIG. 8B the underlying insulating film 13 made of silicon oxide or silicon oxynitride and the high dielectric film 14 having a thickness of about 2 nm are sequentially formed on the semiconductor substrate 10. The formation of the underlying insulating film 13 is necessary only at least between the active regions 10a and 10b and the high dielectric film 14, and is not necessarily required on the element isolation regions 12. For example, in formation of a silicon oxide film having a thickness of 1 nm or less by RTO, etc. as the underlying insulating film 13, the silicon oxide film is selectively formed on the active layers 10a and 10b of the semiconductor substrate 10 where silicon is exposed, but is not formed on the element isolation regions 12 where no silicon is exposed. Therefore, with no formation of the underlying insulating film 13 made of silicon oxide on the element isolation regions 12, the high dielectric film 14 is to be formed directly on the element isolation regions 12. For the high dielectric film 14, similar materials to those in the first example embodiment can be used.

Figure 8C:
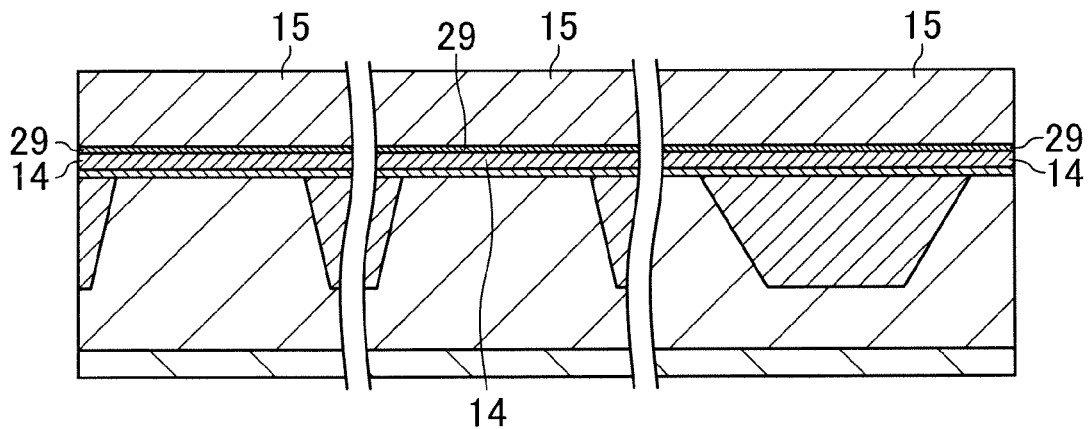

As shown in FIG. 8C, an Al-containing film 29 containing Al as the adjustment metal for the p-type MIS transistor, made of aluminum oxide ($Al_xO_y$), for example, and a metal mask film 15 are formed sequentially on the high dielectric film 14. It is preferable to form the Al-containing film 29 by sputtering, etc. As the metal mask film 15, a TiN film having a thickness of about 10 nm, for example, may be formed to by ALD, CVD, PVD, etc.

As shown in FIG. 9A a resist film 16 having an opening in the n-type MIS transistor region 1a and covering the p-type MIS transistor region 1b and the resistance element region 1x is formed on the metal mask film 15. Using the resist film 16 as a mask, the portion of the metal mask film 15 in the n-type MIS transistor region 1a is removed while the portions thereof in the p-type MIS transistor region 1b and the resistance element region 1x are left unremoved, to expose the Al-containing film 29 in the n-type MIS transistor region 1a.

As shown in FIG. 9B, after removal of the resist film 16 by a known ashing method, etc., the portion of the Al-containing film 29 in the n-type MIS transistor region 1a is removed by wet etching, while the portions thereof in the p-type MIS transistor region 1b and the resistance element region 1x are left unremoved, using the metal mask film 15 as a mask. The high dielectric film 14 is thus exposed in the n-type MIS transistor region 1a.

As shown in FIG. 9C, a La-containing film 17 made of lanthanum oxide ($La_xO_y$), for example, which contains La as the adjustment metal for the n-type MIS transistor, is formed on the entire surface of the semiconductor substrate 10 by sputtering, for example. As a result, while the La-containing film 17 is formed directly on the high dielectric film 14 in the n-type MIS transistor region 1a, it is not directly formed on the high dielectric film 14 in the p-type MIS transistor region 1b and the resistance element region 1x but is formed on the metal mask film 15.

Figure 10A:
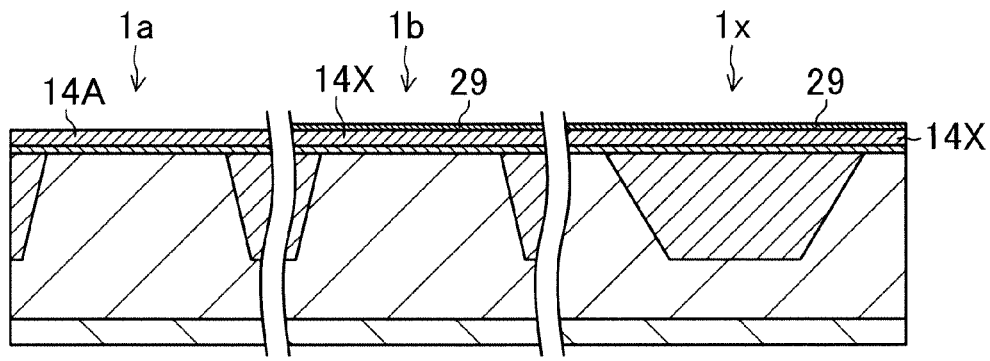
FIGS. 10A-10C are step-by-step cross-sectional views showing the fabrication method of the second example embodiment.

As shown in FIG. 10A, annealing is performed at 700° C. for 120 minutes, for example, to allow La as the adjustment metal to be diffused from the La-containing film 17 into only the portion of the high dielectric film 14 in the n-type MIS transistor region 1a, to form a La-containing high dielectric film 14A. At this time, no La is diffused into the portions of the high dielectric film 14 in the p-type MIS transistor region 1b and the resistance element region 1x with the metal mask film 15 serving as the diffusion prevention film, leaving intact the high dielectric film 14 as a La-free high dielectric film 14X. The remaining La-containing film 17 and the metal mask film 15 are then removed.

Figure 10B:
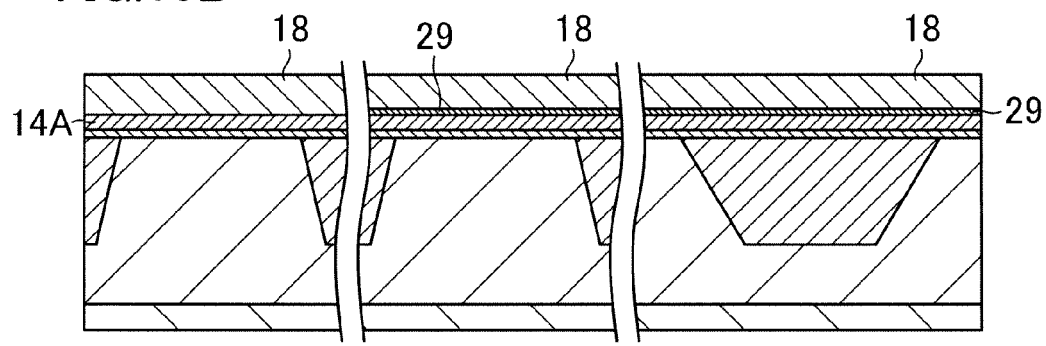

As shown in FIG. 10B, a metal film 18 that is to be part of the gate electrodes is formed on the La-containing high dielectric film 14A in the n-type MIS transistor region 1a and the Al-containing film 29 in the p-type MIS transistor region 1b and the resistance element region 1x. As the metal film 18, a TiN film having a thickness of about 15 nm may be formed by ALD, CVD, PVD, etc.

Figure 10C:
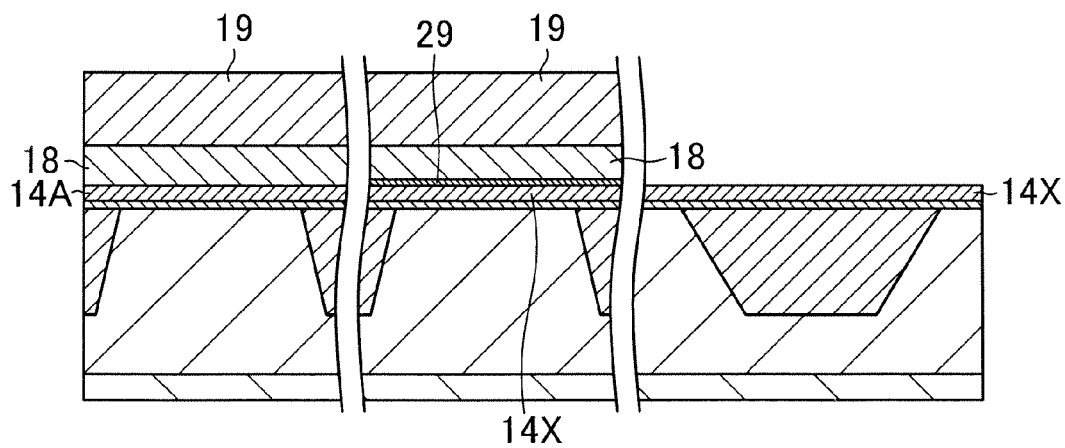

As shown in FIG. 10C, a resist film 19 having an opening in the resistance element region 1x and covering the n-type MIS transistor region 1a and the p-type MIS transistor region 1b is formed on the metal film 18. Using the resist film 19 as a mask, the portions of the metal film 18 and the Al-containing film 29 in the resistance element region 1x are removed by wet etching or dry etching. Thus, while the metal film 18 remains unremoved on the La-containing high dielectric film 14A in the n-type MIS transistor region 1a, and the Al-containing film 29 and the metal film 18 remain unremoved on the La-free high dielectric film 14X in the p-type MIS transistor region 1b, neither the Al-containing film 29 nor the metal film 18 exists on the La-free high dielectric film 14X in the resistance element region 1x. Note that it is not necessarily required to remove the portion of the Al-containing film 29 on the La-free high dielectric film 14X in the resistance element region 1x but may be left unremoved. This case poses no particular problem with the Al-containing film 29 left on the La-free high dielectric film 14X in the resistance element region 1x because, unlike the case of La, no abnormal growth will occur when a silicon film that is to be the resistance layer is formed on the Al-containing film 29.

Figure 11A:
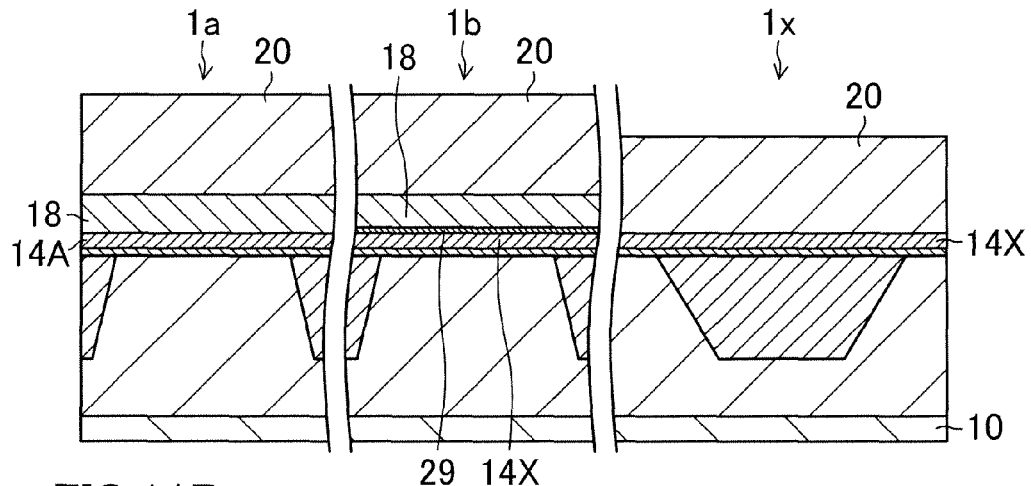
FIGS. 11A-11C are step-by-step cross-sectional views showing the fabrication method of the second example embodiment.

As shown in FIG. 11A, after removal of the resist film 19 by a known ashing method, etc., a silicon film 20 made of polysilicon having a thickness of about 100 nm is formed on the entire surface of the semiconductor substrate 10 by CVD, for example. Thus, while the silicon film 20 is formed on the La-containing high dielectric film 14A via the metal film 18 in the n-type MIS transistor region 1a and on the La-free high dielectric film 14X via the Al-containing film 29 and the metal film 18 in the p-type MIS transistor region 1b, it is directly formed on the La-free high dielectric film 14X in the resistance element region 1x.

Figure 11B:
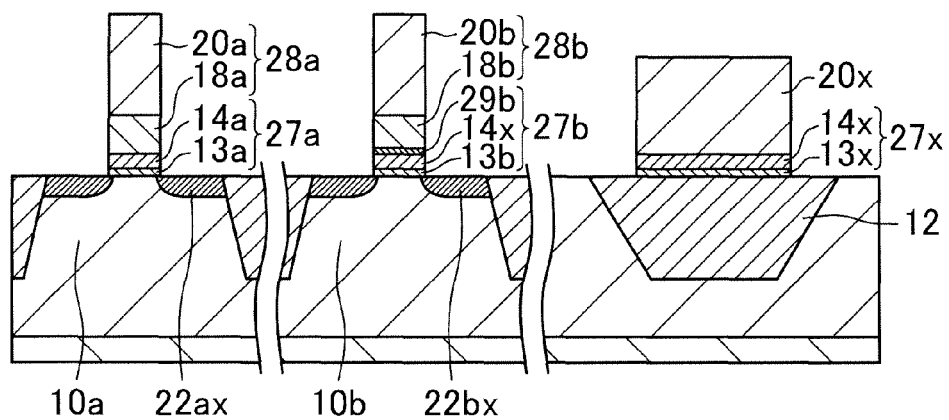

As shown in FIG. 11B, a resist film (not shown) having a gate electrode pattern and a resistance element pattern is formed on the silicon film 20 by lithography, for example. Using the resist film as a mask, the silicon film 20, the metal film 18, the Al-containing film 29, the La-containing high dielectric film 14A, the La-free high dielectric film 14X, and the underlying insulating film 13 are sequentially patterned by dry etching, and then the resist film is removed. As a result, in the n-type MIS transistor region 1a, formed on the active region 10a are the gate insulating film 27a comprised of the underlying insulating film 13a and the La-containing high dielectric film 14a and the gate electrode 28a comprised of the metal film 18a and the silicon film 20a. In the p-type MIS transistor region 1b, formed on the active region 10b are the gate insulating film 27b comprised of the underlying insulating film 13b, the La-free high dielectric film 14x, and the Al-containing film 29b and the gate electrode 28b comprised of the metal film 18b and the silicon film 20b. In the resistance element region 1x, formed on the element isolation region 12 are the lower insulating film 27x comprised of the underlying insulating film 13x and the La-free high dielectric film 14x and the resistance layer 20x. With the formation of the resistance layer 20x on the element isolation region 12, the substrate is prevented from being etched during the patterning. Thereafter, in the n-type MIS transistor region 1a, using the gate electrode 28a as a mask, an n-type impurity is implanted selectively in the active region 10a by ion implantation, to form the shallow n-type source/drain regions 22ax in portions of the active region 10a under the sides of the gate electrode 28a in a self-aligned manner. At this time, the n-type impurity is also implanted in the resistance layer 20x to form the n-type resistance layer 20x. Likewise, in the p-type MIS transistor region 1b, using the gate electrode 28b as a mask, a p-type impurity is implanted selectively in the active region 10b by ion implantation, to form the shallow p-type source/drain regions 22bx in portions of the active region 10b under the sides of the gate electrode 28b in a self-aligned manner.

Figure 11C:
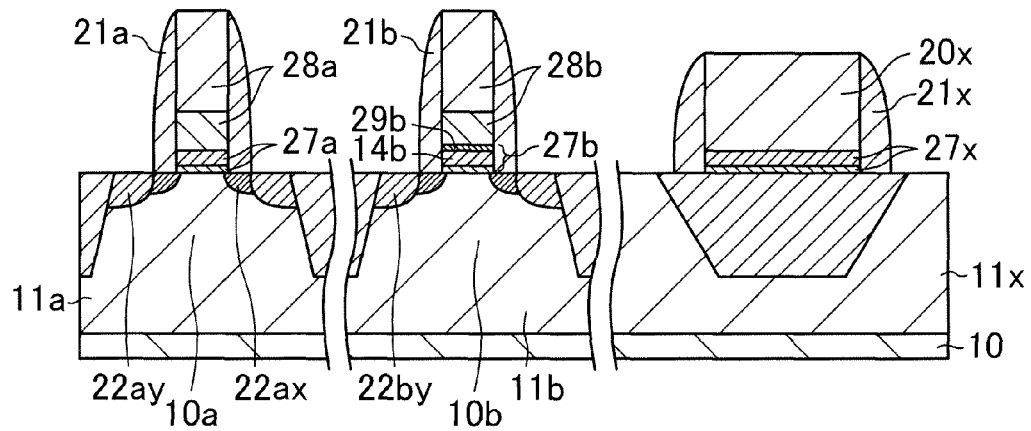

As shown in FIG. 11C, an insulating film is formed on the entire surface of the semiconductor substrate 10 and then etched back, to form the sidewall insulating films 21a on the side faces of the gate electrode 28a and the gate insulating film 27a, the sidewall insulating films 21b on the side faces of the gate electrode 28b and the gate insulating film 27b, and the sidewall insulating films 21x on the side faces of the resistance layer 20x and the lower insulating film 27x. The sidewall insulating films 21a, 21b, and 21x may be a single-layer film or a multilayer film made of silicon oxide or silicon nitride. Thereafter, in the n-type MIS transistor region 1a, using the gate electrode 28a and the sidewall insulating films 21a as a mask, an n-type impurity is implanted in the active region 10a by ion implantation, to form the deep n-type source/drain regions 22ay in portions of the active region 10a under the outer sides of the sidewall insulating films 21a in a self-aligned manner. At this time, the n-type impurity is also implanted in the resistance layer 20x to form the n-type resistance layer 20x. Likewise, in the p-type MIS transistor region 1b, using the gate electrode 28b and the sidewall insulating films 21b as a mask, a p-type impurity is implanted in the active region 10b by ion implantation, to form the deep p-type source/drain regions 22by in portions of the active region 10b under the outer sides of the sidewall insulating films 21b in a self-aligned manner. Note that, although ion implantation is performed for the resistance layer 20x twice at the formation of the shallow n-type source/drain regions 22ax and the formation of the deep n-type source/drain regions 22ay in this embodiment, it may be performed only once at either occasion. Otherwise, no ion implantation may be performed at such occasions, but separate ion implantation of an n-type impurity may be performed. During heat treatment for activating the impurities in the deep n-type source/drain region 22ay and the deep p-type source/drain region 22by, Al as the adjustment metal for the p-type MIS transistor is diffused from the Al-containing film 29 into only the portion of the La-free high dielectric film 14x in the p-type MIS transistor region 1b, to form the Al-containing high dielectric film 14b.

Figure 12A:
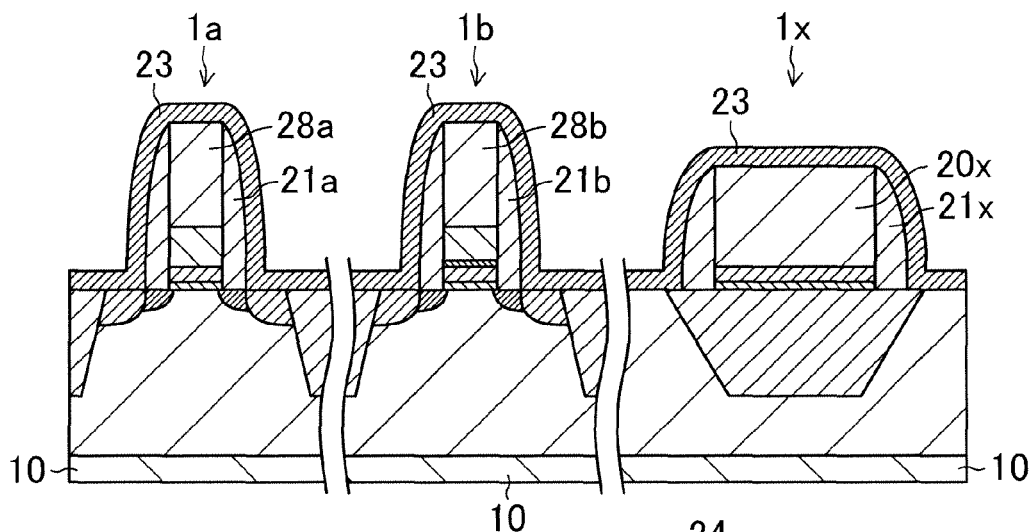
FIGS. 12A-12C are step-by-step cross-sectional views showing the fabrication method of the second example embodiment.

As shown in FIG. 12A, the protective insulating film 23 made of silicon oxide is formed on the entire surface of the semiconductor substrate 10 by CVD, for example, to cover the gate electrodes 28a and 28b, the resistance film 20x, and the sidewall insulating films 21a, 21b, and 21x.

Figure 12B:
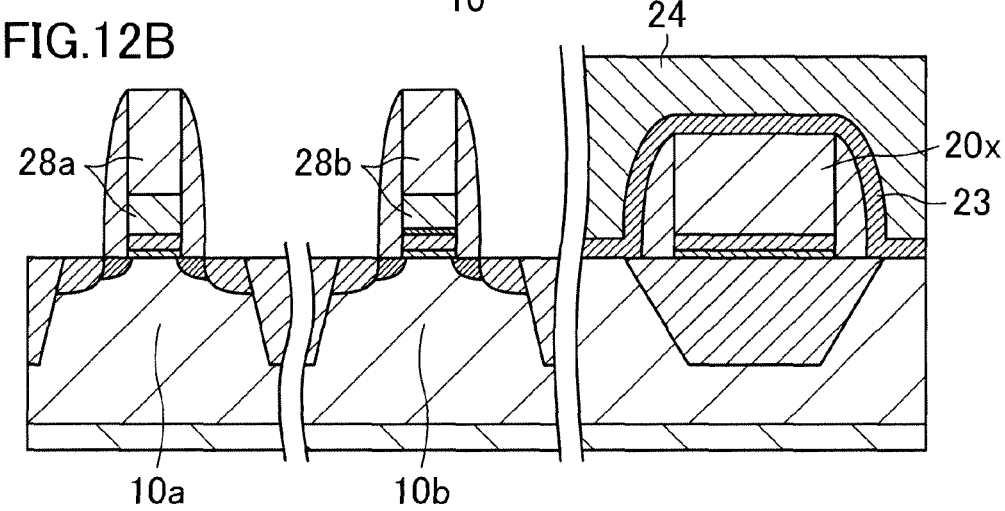

As shown in FIG. 12B, on the protective insulating film 23, formed is a resist film 24 having openings above the active regions 10a and 10b in the n-type and p-type MIS transistor regions 1a and 1b that are silicide formation regions and covering the resistance element region 1x that is a non-silicide formation region. Using the resist film 24 as a mask, the portions of the protective insulating film 23 in the silicide formation regions are removed by wet etching. Thus, while the protective insulating film 23 does not exist above the active region 10a including the gate electrode 28a and the active region 10b including the gate electrode 28b in the n-type and p-type MIS transistor regions 1a and 1b, it remains unremoved in the resistance element region 1x covering the top of the resistance layer 20x.

Figure 12C:
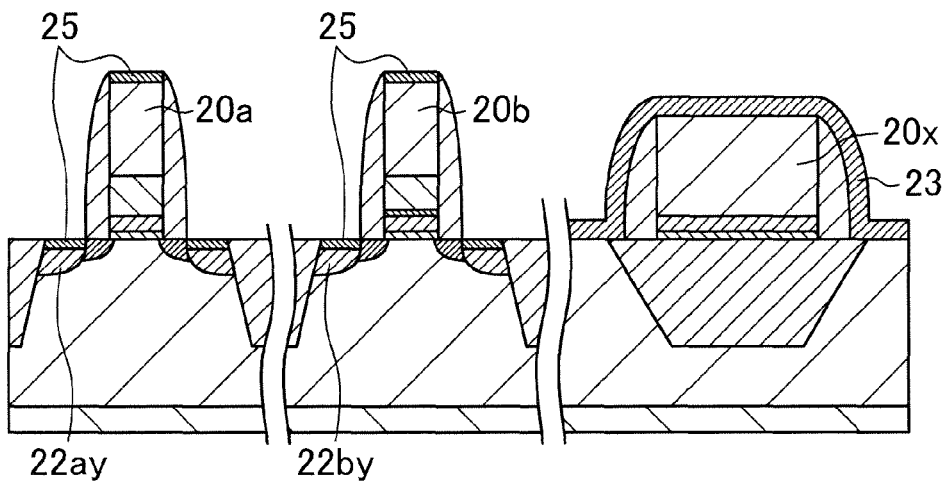
Figure 13A:
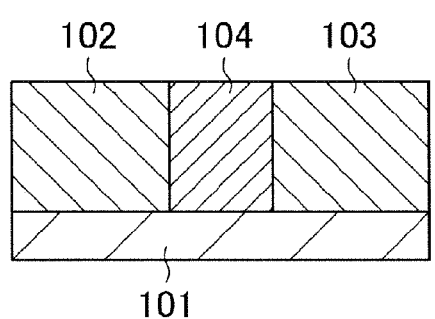
FIGS. 13A-13F are step-by-step cross-sectional views showing a conventional method for fabricating a semiconductor device.
Figure 13D:
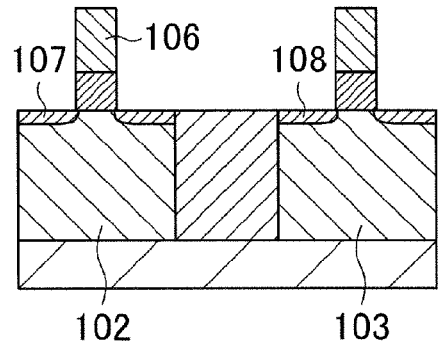
Figure 13B:
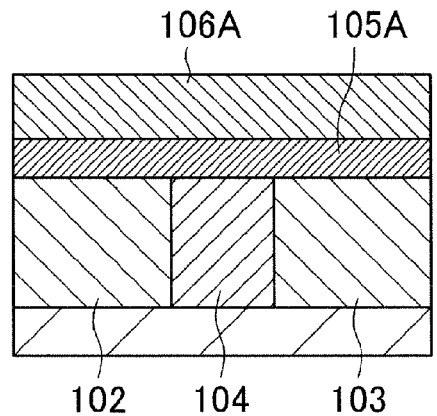
Figure 13E:
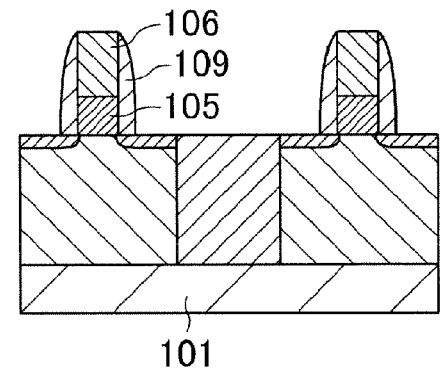
Figure 13C:
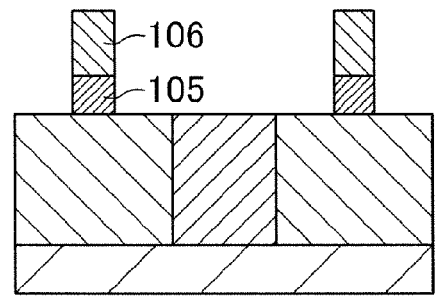
Figure 13F:
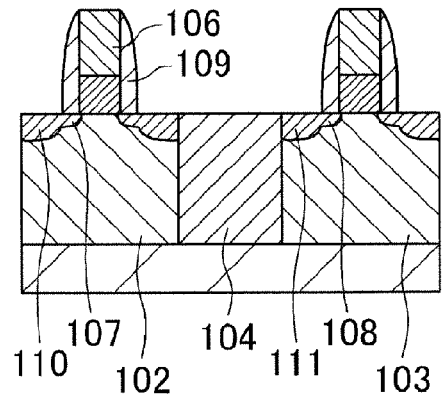
Figure 14A:
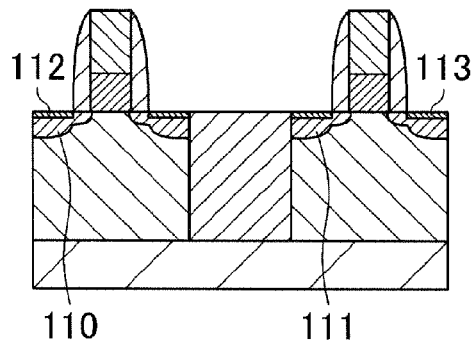
FIGS. 14A-14F are step-by-step cross-sectional views showing the conventional fabrication method.
Figure 14D:
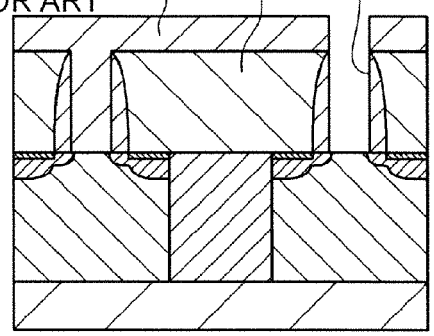
Figure 14B:
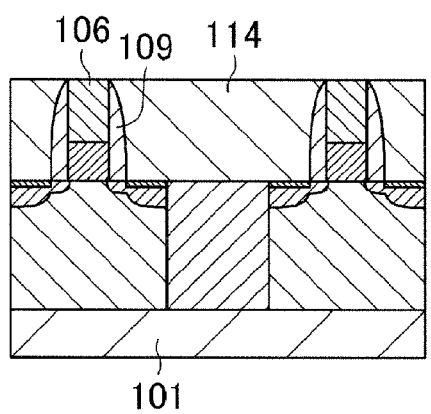
Figure 14E:
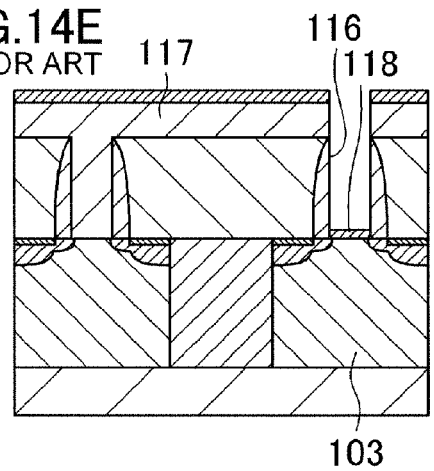
Figure 14C:
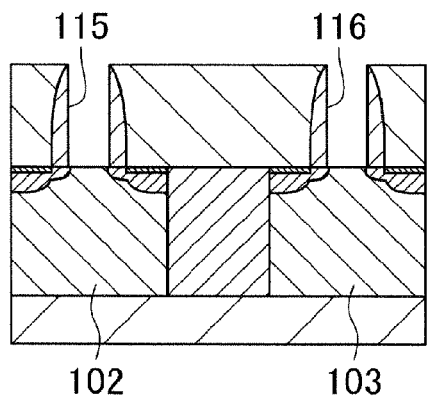
Figure 14F:
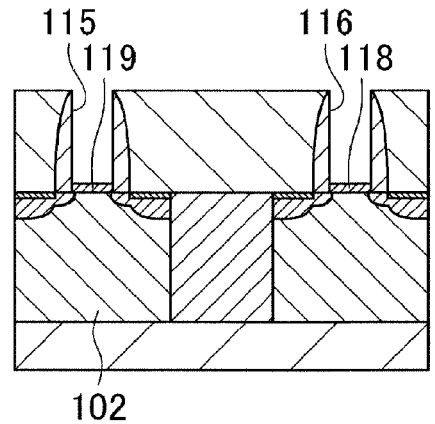
Figure 15:
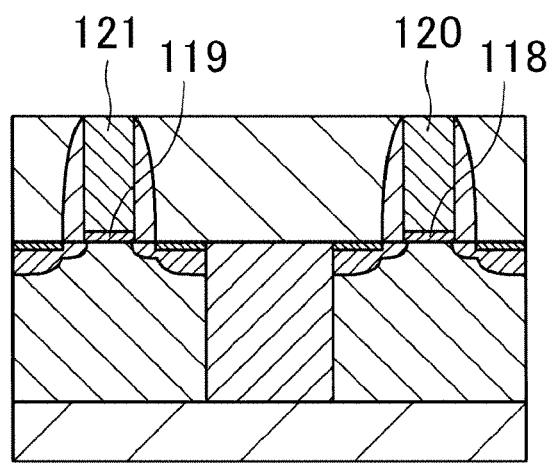
FIG. 15 is a cross-sectional view showing a step of the conventional fabrication method.

As shown in FIG. 12C, after removal of the resist film 24 by a known ashing method, etc., silicide layers 25 are formed in upper portions of the silicon film 20a of the gate electrode 28a, the deep n-type source/drain regions 22ay, the silicon film 20b of the gate electrode 28b, and the deep p-type source/drain regions 22by by the salicide technique of forming silicide in a self-aligned manner. In the resistance element region 1x, although not shown, a portion of the protective insulating film 23 corresponding to a contact formation region of the resistance layer 20x may be removed to form a silicide layer.

Thereafter, as shown in FIG. 7, the interlayer insulating film 26 is formed on the semiconductor substrate 10 to cover the active region 10a including the gate electrode 28a, the active region 10b including the gate electrode 28b, and the resistance layer 20x. The process then proceeds to steps of forming contact plugs and interconnects, which are according to a general method for fabricating a semiconductor device, and thus description of such steps is omitted here.

According to the method for fabricating a semiconductor device of the second example embodiment, since La serving as the adjustment metal for the n-type MIS transistor is contained in the La-containing high dielectric film 14a of the gate insulating film 27a of the n-type MIS transistor, an appropriate threshold voltage can be secured. Likewise, since Al serving as the adjustment metal for the p-type MIS transistor is contained in the Al-containing high dielectric film 14b of the gate insulating film 27b of the p-type MIS transistor, an appropriate threshold voltage can be secured. Also, since La that may cause abnormal growth is not contained in the La-free high dielectric film 14x of the lower insulating film 27x of the resistance element, the resistance layer 20x made of silicon formed on, and in contact with, the La-free high dielectric film 14x can be prevented from growing abnormally. In this way, a semiconductor device capable of obtaining a stable resistance value can be implemented.

Although the first and second example embodiments were described as forming the resistance elements that are passive elements, fuse elements, alignment marks at patterning of gate electrodes, etc. can also be formed, in place of the resistance elements, in a similar way.

As described above, in the semiconductor device and the method for fabricating the same of the present disclosure, it is possible to allow the transistors to have their appropriate threshold voltages, and also prevent the silicon film used as the resistance layer of the resistance element from growing abnormally, permitting stabilization of the thickness of the resistance layer. Thus, the present disclosure is applicable, in particular, to semiconductor devices having a gate insulating film including a high dielectric material and a method for fabricating the same.

What is claimed is:
1. A semiconductor device, comprising:
a first metal insulator semiconductor (MIS) transistor of a first conductivity type having a first active region as a region of a semiconductor substrate surrounded by an element isolation region formed in an upper portion of the semiconductor substrate, a first gate insulating film having a first high dielectric film formed on the first active region, and a first gate electrode formed on the first gate insulating film; and a resistance element having a second high dielectric film formed on the element isolation region and a resistance layer made of a first silicon film formed on the second high dielectric film, wherein the first high dielectric film and the second high dielectric film include a same high dielectric material, and the first high dielectric film includes a first adjustment metal, but the second high dielectric film does not include the first adjustment metal, the semiconductor device further includes a second MIS transistor of a second conductivity type having a second active region as a region of the semiconductor substrate surrounded by the element isolation region formed in an upper portion of the semiconductor substrate, a second gate insulating film having a third high dielectric film formed on the second active region, and a second gate electrode formed on the second gate insulating film, the third high dielectric film includes the same high dielectric material as the first high dielectric film and the second high dielectric film, and includes a second adjustment metal, but does not include the first adjustment metal, and the second gate insulating film includes a second underlying insulating film formed on the second active region, the third high dielectric film formed on the second underlying insulating film, and a second adjustment metal-containing film containing the second adjustment metal formed on the third high dielectric film.

2. The semiconductor device of claim 1, wherein the first gate electrode is formed on, and in contact with, the first high dielectric film of the first gate insulating film.

3. The semiconductor device of claim 1, wherein the resistance layer is formed only above the element isolation region.

4. The semiconductor device of claim 1, further comprising:
a protective insulating film formed on the resistance layer, wherein the protective insulating film is not formed above the first active region including the first gate electrode.

5. The semiconductor device of claim 1, wherein the first gate insulating film includes a first underlying insulating film formed on the first active region and the first high dielectric film formed on the first underlying insulating film.

6. The semiconductor device of claim 1, further comprising:
first sidewall insulating films formed on the side faces of the first gate insulating film and the first gate electrode; and
second sidewall insulating films formed on the side faces of the second high dielectric film and the resistance layer.

7. The semiconductor device of claim 1, further comprising:
a silicide layer formed on the first gate electrode.

8. The semiconductor device of claim 1, wherein the first adjustment metal is a metal with which silicon grows abnormally.

9. The semiconductor device of claim 1, wherein the first MIS transistor is an n-type MIS transistor,
the resistance layer is made of n-type silicon, and
the first adjustment metal is lanthanum.

10. The semiconductor device of claim 1, wherein the second high dielectric film includes the second adjustment metal.

11. The semiconductor device of claim 1, wherein the second gate electrode includes a second metal film formed on the second gate insulating film and a third silicon film formed on the second metal film.

12. The semiconductor device of claim 1, wherein the second MIS transistor is a p-type MIS transistor, and
the second adjustment metal is aluminum.

13. The semiconductor device of claim 1, wherein the second high dielectric film is formed on the element isolation region via a third underlying insulating film.

14. The semiconductor device of claim 1, wherein the second high dielectric film is formed on, and in contact with, the element isolation region.

* * * * *